(12) United States Patent
Baeck et al.

(10) Patent No.: US 12,142,691 B2
(45) Date of Patent: Nov. 12, 2024

(54) THIN FILM TRANSISTOR, METHOD FOR MANUFACTURING THE THIN FILM TRANSISTOR AND DISPLAY DEVICE COMPRISING THE THIN FILM TRANSISTOR

(71) Applicant: LG Display Co., Ltd., Seoul (KR)

(72) Inventors: JuHeyuck Baeck, Paju-si (KR); Dohyung Lee, Paju-si (KR); ChanYong Jeong, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 378 days.

(21) Appl. No.: 17/563,887

(22) Filed: Dec. 28, 2021

(65) Prior Publication Data

US 2022/0209019 A1 Jun. 30, 2022

(30) Foreign Application Priority Data

Dec. 29, 2020 (KR) .................. 10-2020-0186700
Dec. 9, 2021 (KR) .................. 10-2021-0175278

(51) Int. Cl.
*H01L 29/786* (2006.01)
*H01L 29/49* (2006.01)
*H01L 29/66* (2006.01)

(52) U.S. Cl.
CPC .. *H01L 29/78648* (2013.01); *H01L 29/66969* (2013.01); *H01L 29/7869* (2013.01); *H01L 29/78696* (2013.01); *H01L 29/4908* (2013.01)

(58) Field of Classification Search
None
See application file for complete search history.

(56) References Cited

U.S. PATENT DOCUMENTS

| | | | |
|---|---|---|---|
| 2009/0283763 A1 | 11/2009 | Park et al. | |
| 2011/0095286 A1* | 4/2011 | Kim | H01L 29/7869 257/43 |
| 2012/0146713 A1 | 6/2012 | Kim et al. | |
| 2012/0319118 A1 | 12/2012 | Yamazaki | |
| 2016/0240683 A1 | 8/2016 | Miyake et al. | |
| 2021/0327924 A1* | 10/2021 | He | H01L 27/1248 |

FOREIGN PATENT DOCUMENTS

| | | |
|---|---|---|
| EP | 2 927 965 A1 | 10/2015 |
| KR | 10-2017-0005124 A | 1/2017 |
| KR | 10-2019-0074812 A | 6/2019 |
| KR | 10-2020-0131204 A | 11/2020 |

* cited by examiner

*Primary Examiner* — Alexander G Ghyka

(74) *Attorney, Agent, or Firm* — Birch, Stewart, Kolasch & Birch, LLP

(57) ABSTRACT

A thin film transistor can include a first gate electrode, an active layer including a channel portion, and a second gate electrode. The active layer is between the first gate electrode and the second gate electrode, and at least a portion of the first gate electrode does not overlap with the second gate electrode. Further, at least a portion of the second gate electrode does not overlap with the first gate electrode, and the channel portion overlaps with at least one of the first gate electrode and the second gate electrode. In addition, a first portion of the channel portion can overlaps with one of the first gate electrode and the second gate electrode, and a second portion of the channel portion can overlap with a remaining one of the first gate electrode and the second gate electrode that is not overlapped by the first portion of the channel portion.

16 Claims, 16 Drawing Sheets

THIN FILM TRANSISTOR, METHOD FOR MANUFACTURING THE THIN FILM TRANSISTOR AND DISPLAY DEVICE COMPRISING THE THIN FILM TRANSISTOR

CROSS-REFERENCE TO RELATED APPLICATIONS

This application claims priority to Korean Patent Application No. 10-2020-0186700 filed in the Republic of Korea on Dec. 29, 2020, and Korean Patent Application No. 10-2021-0175278 filed in the Republic of Korea on Dec. 9, 2021, the entire contents of all these applications being hereby incorporated by reference as if fully set forth herein into the present application.

BACKGROUND

Field of the Invention

The present disclosure relates to a thin film transistor, a method for manufacturing the thin film transistor, and a display device comprising the thin film transistor.

Discussion of the Related Art

Since a thin film transistor can be manufactured on a glass substrate or a plastic substrate, the thin film transistor has been widely used as a switching element or a driving element of a display device, such as a liquid crystal display device or an organic light emitting device.

The thin film transistor can be categorized into an amorphous silicon thin film transistor in which amorphous silicon is used as an active layer, a polycrystalline silicon thin film transistor in which polycrystalline silicon is used as an active layer, and an oxide semiconductor thin film transistor in which oxide semiconductor is used as an active layer, based on a material constituting the active layer.

Since amorphous silicon can be deposited in a short time to form an active layer, an amorphous silicon thin film transistor (a-Si TFT) can have advantages in that manufacturing process time is short and production cost is low. On the other hand, the amorphous silicon thin film transistor can have a drawback in that the amorphous silicon thin film transistor is restrictively used for an active matrix organic light emitting diode (AMOLED) because a current driving capacity can have some undesirable traits of low mobility and there is a change in a threshold voltage.

A polycrystalline silicon thin film transistor (poly-Si TFT) can be made by depositing amorphous silicon and crystallizing the deposited amorphous silicon. The polycrystalline silicon thin film transistor can have advantages in that electron mobility is high, stability is excellent, thin profile and high resolution can be embodied, and power efficiency is high. Examples of the polycrystalline silicon thin film transistor include a low temperature poly silicon (LTPS) thin film transistor and a polysilicon thin film transistor.

However, since a process of manufacturing the polycrystalline silicon thin film transistor uses a step of crystallizing the amorphous silicon, a manufacturing cost can be increased due to the increased number of the process steps and crystallization is needed at a high temperature. Therefore, it may be difficult to apply the polycrystalline silicon thin film transistor to a large-sized display device. Also, it may be difficult to ensure uniformity of the polycrystalline silicon thin film transistors due to polycrystalline properties.

An oxide semiconductor thin film transistor (TFT), which has high mobility and has a large resistance change in accordance with an oxygen content, can have an advantage in that desired properties may easily be obtained. Further, since an oxide constituting an active layer may be grown at a relatively low temperature during a process of manufacturing the oxide semiconductor thin film transistor, the manufacturing cost of the oxide semiconductor thin film transistor can be reduced. In view of the properties of oxide, since an oxide semiconductor is transparent, oxide semiconductor TFTs can be favorable for use in a transparent display. However, the oxide semiconductor thin film transistor can have issues regarding stability and electron mobility may deteriorate as compared with the polycrystalline silicon thin film transistor.

When the oxide semiconductor thin film transistor (TFT) is driven in an ON-state for a long time, a threshold voltage of the oxide semiconductor TFT tends to change over time. Due to this change in the driving characters of the TFT, the life of the device may be shortened, image quality can degrade, and costly compensation techniques and additional circuitry may be needed. Therefore, it is desirable to improve the driving stability of the oxide semiconductor thin film transistor.

SUMMARY OF THE DISCLOSURE

The present disclosure has been made in view of the above problems and limitations associated with the related art, and it is an object of the present disclosure to provide a thin film transistor that has properties of a top gate structure and a bottom gate structure to minimize a change rate of a threshold voltage.

It is another object of the present disclosure to provide a thin film transistor having improved driving stability due to the presence of a portion affected by a top gate and a portion affected by a bottom gate in one channel portion.

It is still another object of the present disclosure to provide a thin film transistor having improved driving stability as a portion for moving a threshold voltage to a positive (+) direction and a portion for moving the threshold voltage to a negative (−) direction are connected with each other in series in one channel portion.

It is further still another object of the present disclosure to provide a thin film transistor including a channel portion having an excess oxygen area and an excess hydrogen area.

It is further still another object of the present disclosure to provide a thin film transistor that can minimize a change of a threshold voltage by inducing movement of a threshold voltage to a positive (+) direction by electron trap in an excess oxygen area and inducing movement of the threshold voltage to a negative (−) direction by hole trap in an excess hydrogen area.

It is further still another object of the present disclosure to provide a method for manufacturing the thin film transistor.

It is further still another object of the present disclosure to provide a display device including the thin film transistor.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a thin film transistor including a first gate electrode, an active layer spaced apart from the first gate electrode, including a channel portion, and a second gate electrode spaced apart from the active layer and disposed at an opposite side of the first gate electrode based on the active layer. At least a portion of the first gate electrode does not overlap with the second gate electrode, and at least a portion of the second gate electrode does not overlap with the first gate electrode. The channel portion overlaps with at least one of the first gate electrode and the second gate electrode, a portion of the channel portion overlaps only one of the first gate electrode and the second gate electrode and another portion of the channel portion overlaps only the other one of the first gate electrode and the second gate electrode. The active layer includes a first active layer including an oxide semiconductor material, and a second active layer disposed on the first active layer, including an oxide semiconductor material, and any one of the first active layer and the second active layer has a higher hydrogen concentration and a lower oxygen concentration than the other one.

The channel portion can include a first channel area that overlaps with the first gate electrode and does not overlap the second gate electrode, and a second channel area that overlaps with the second gate electrode and does not overlap the first gate electrode.

The first channel area is positioned at one end of the channel portion, and the second channel area is positioned at the other end of the channel portion.

The active layer includes a first connection portion and a second connection portion, which are separated from each other and respectively connected with the channel portion.

The first connection portion is in contact with the first channel area, and the second connection portion is in contact with the second channel area.

The first connection portion may not overlap the second gate electrode, and the second connection portion may not overlap the first gate electrode.

At least a portion of the first connection portion can overlap with the first gate electrode.

A portion of the first gate electrode and a portion of the second gate electrode can overlap each other.

A portion of the channel portion can overlap both of the first gate electrode and the second gate electrode.

The thin film transistor can further comprise a hydrogen supply layer disposed between the first gate electrode and the active layer.

The thin film transistor can further comprise an oxygen supply layer disposed between the active layer and the second gate electrode.

The first active layer and the second active layer can have the same metal composition.

The first active layer can have a higher hydrogen concentration than the second active layer, and the second active layer can have an oxygen concentration higher than the first active layer.

The thin film transistor can further comprise a hydrogen supply layer on the active layer.

The first active layer can have a higher oxygen concentration than the second active layer, and the second active layer can have a higher hydrogen concentration than the first active layer.

The first active layer can have a first area overlapped with the first gate electrode, and the first area can have a hydrogen concentration higher than that of the other area of the first active layer.

The second active layer can have a second area overlapped with the second gate electrode, and the second area can have an oxygen concentration higher than an oxygen concentration of the other area of the second active layer.

In accordance with another aspect of the present disclosure, the above and other objects can be accomplished by the provision of a display device including the above thin film transistor.

In accordance with other aspect of the present disclosure, the above and other objects can be accomplished by the provision of a method for manufacturing a thin film transistor, which includes forming a first gate electrode on a substrate, forming a first gate insulating layer on the first gate electrode, forming an active layer on the first gate insulating layer, and forming a second gate electrode on the active layer, in which at least a portion of the first gate electrode does not overlap the second gate electrode and at least a portion of the second gate electrode does not overlap the first gate electrode, the active layer has a channel portion, and the channel portion overlaps with at least one of the first gate electrode and the second gate electrode, the active layer includes a first active layer and a second active layer on the first active layer, and any one of the first active layer and the second active layer has a higher hydrogen concentration and a lower oxygen concentration than the other one.

A portion of the first gate electrode and a portion of the second gate electrode can overlap each other.

The method for manufacturing a thin film transistor can further include forming a hydrogen supply layer prior to forming the first gate insulating layer.

The method for manufacturing a thin film transistor can further include oxygen-treating a surface of the active layer.

The oxygen-treating can include treating the surface of the active layer with $N_2O$ gas.

The forming the second gate electrode can include forming a second gate electrode pattern.

The method for manufacturing a thin film transistor can further include conductorizing the active layer by using the second gate electrode pattern as a mask.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE EMBODIMENTS

Figure 1:
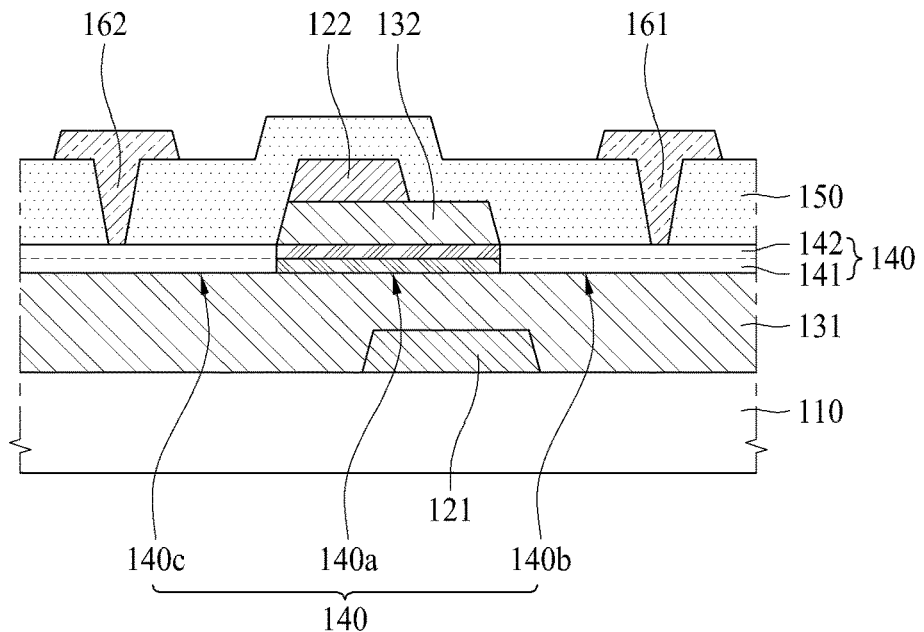
FIG. 1 is a cross-sectional view illustrating a thin film transistor according to an embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a situation where "comprise," "have," and "include" described in the present specification are used, another part may be added unless "only" is used. The terms of a singular form may include plural forms unless referred to the contrary.

In construing an element, the element is construed as including an error range although there is no explicit description.

In describing a position relationship, for example, when the position relationship is described as "upon," "above," "over," "below," and "next to," one or more portions may be arranged between two other portions unless "just" or "direct" is used.

Spatially relative terms such as "below," "beneath," "lower," "above," and "upper" may be used herein to easily describe a relationship of one element or elements to another element or elements as illustrated in the figures. It will be understood that these terms are intended to encompass different orientations of the device in addition to the orientation depicted in the figures. For example, if the device illustrated in the figure is reversed, the device described to be arranged "below," or "beneath" another device may be arranged "above" another device. Therefore, an exemplary term "below or beneath" may include "below or beneath" and "above" orientations. Likewise, an exemplary term "above" or "on" may include "above" and "below or beneath" orientations.

In describing a temporal relationship, for example, when the temporal order is described as "after," "subsequent," "next," and "before," a situation which is not continuous may be included, unless "just" or "direct" is used.

It will be understood that, although the terms "first," "second," etc. may be used herein to describe various elements, these elements should not be limited by these terms. These terms are only used to distinguish one element from another element. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

In the drawings, the same or similar elements are denoted by the same reference numerals even though they are depicted in different drawings. Wherever possible, the same reference numbers will be used throughout the drawings to refer to the same or like parts.

In the embodiments of the present disclosure, a source electrode and a drain electrode are distinguished from each other, for convenience of description. However, the source electrode and the drain electrode may be used interchangeably. The source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In some embodiments of the present disclosure, for convenience of description, a source area is distinguished from a source electrode and a drain area is distinguished from a drain electrode. However, the embodiments of the present disclosure are not limited to this structure. For example, the source area can be the source electrode and the drain area can be the drain electrode. Also, the source area can be the drain electrode, and the drain area can be the source electrode. All the components of each thin film transistor and each display device having such thin film transistors according to all embodiments of the present disclosure are operatively coupled and configured.

FIG. 1 is a cross-sectional view illustrating a thin film transistor 100 according to one embodiment of the present disclosure.

Referring to FIG. 1, the thin film transistor 100 according to one embodiment of the present disclosure includes a first gate electrode 121, an active layer 140, and a second gate electrode 122.

The active layer 140 is disposed to be spaced apart from the first gate electrode 121. At least a portion of the active layer 140 overlaps with the first gate electrode 121.

The second gate electrode 122 is spaced apart from the active layer 140 and disposed opposite to the first gate electrode 121 based on the active layer 140. The first gate electrode 121 is disposed on one side of the active layer 140 (e.g., below), and the second gate electrode 122 is disposed on the other side of the active layer 140 (e.g., above).

The active layer 140 includes a channel portion 140a. The channel portion 140a overlaps with at least one of the first gate electrode 121 and the second gate electrode 122 or both. Also, first gate electrode 121 can be wider than the second gate electrode 122, and the first gate electrode 121 can overlap more of the channel portion 140a than the second gate electrode 122.

Figure 2:
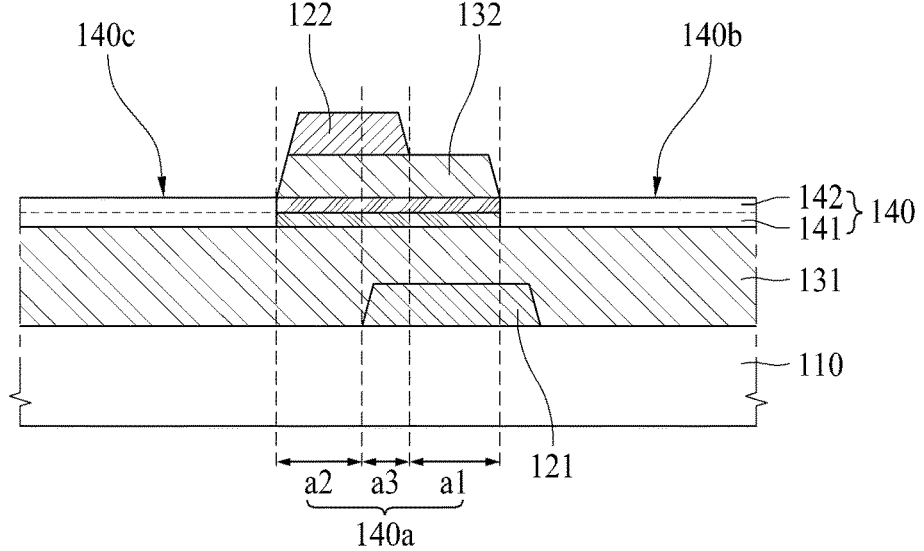
FIG. 2 is an enlarged partial cross-sectional view illustrating a channel portion of a thin film transistor shown in FIG. 1 according to an embodiment of the present disclosure.

FIG. 2 is an enlarged partial cross-sectional view illustrating the channel portion 140a of the thin film transistor 100 shown in FIG. 1.

The thin film transistor 100 according to one embodiment of the present disclosure will be described in more detail with reference to FIGS. 1 and 2.

Referring to FIGS. 1 and 2, the first gate electrode 121 is disposed on a substrate 110.

Glass or plastic can be used as the substrate 110. A transparent plastic, e.g., polyimide, having a flexible property can be used as the plastic. When polyimide is used as the substrate 110, a heat resistant polyimide that is tolerable at high temperature can be used considering a deposition process of high temperature is performed on the substrate 110.

The first gate electrode 121 can include at least one of aluminum-based metals, such as aluminum (Al) or aluminum alloy, silver-based metals such as silver (Ag) or silver alloy, copper-based metals such as copper (Cu) or copper alloy, molybdenum-based metals, such as molybdenum (Mo) or molybdenum alloy, chromium (Cr), tantalum (Ta), neodymium (Nd) or titanium (Ti). The first gate electrode 121 can have a multi-layered structure that includes at least two conductive layers having their respective physical properties different from each other.

A first gate insulating layer 131 is disposed on the first gate electrode 121. The first gate insulating layer 131 can have insulation properties, and can include at least one of a silicon oxide, a silicon nitride or a metal-based oxide. According to one embodiment of the present disclosure, the first gate insulating layer 131 can include a silicon nitride. The silicon nitride includes hydrogen of a relatively higher concentration than the silicon oxide and the metal-based oxide.

The first gate insulating layer 131 can have a single layered structure, or can have a multi-layered structure.

The active layer 140 is disposed on the first gate insulating layer 131.

According to one embodiment of the present disclosure, the active layer 140 includes an oxide semiconductor material. The active layer 140 can be made of an oxide semiconductor layer.

The active layer 140 can include, for example, at least one of IZO(InZnO)-based, IGO(InGaO)-based, ITO(InSnO)-based, IGZO(InGaZnO)-based, IGZTO(InGaZnSnO)-based, ITZO(InSnZnO)-based, IGTO(InGaSnO)-based, GO(GaO)-based, GZTO(GaZnSnO)-based and GZO(GaZnO)-based oxide semiconductor material. However, one embodiment of the present disclosure is not limited to this example, and the active layer 140 can be made of other oxide semiconductor materials known in the art.

The active layer 140 includes a channel portion 140a, a first connection portion 140b and a second connection portion 140c, which are respectively disposed at opposite sides of the channel portion 140a. The first connection portion 140b and the second connection portion 140c are spaced apart from each other and respectively connected with the channel portion 140a.

A second gate insulating layer 132 is disposed on the active layer 140. The second gate insulating layer 132 can have insulation properties, and can include at least one of a silicon oxide, a silicon nitride or a metal-based oxide. The second gate insulating layer 132 can have a single layered structure, or can have a multi-layered structure.

According to one embodiment of the present disclosure, the second gate insulating layer 132 can include a silicon oxide. The silicon oxide can include oxygen of a relatively higher concentration than the silicon nitride.

The second gate insulating layer 132 can be patterned, or may not be patterned. The patterned second gate insulating layer 132 can cover at least the channel portion 140a of the active layer 140, but one embodiment of the present disclosure is not limited thereto. The second gate insulating layer 132 can cover the entire upper surface of the active layer 140.

The second gate electrode 122 is disposed on the second gate insulating layer 132.

The second gate electrode 122 can be made of the same material as that of the first gate electrode 121, or can be made of another material. The second gate electrode 122 is disposed on an opposite side of the first gate electrode 121 based on the active layer 140. For example, the active layer 140 is between the first gate electrode 121 and the second gate electrode 122.

According to one embodiment of the present disclosure, at least a portion of the first gate electrode 121 does not overlap with the second gate electrode 122, and at least a portion of the second gate electrode 122 does not overlap with the first gate electrode 121. A portion of the first gate electrode 121 and a portion of the second gate electrode 122 can overlap each other. For example, the first gate electrode 121, the channel portion 140a and the second gate electrode 122 can be vertically stacked in a staggered type of arrangement, in which the first gate electrode 121 can mainly overlap about one half of the channel portion 140a and the second gate electrode 122 can mainly overlap the other half of the channel portion 140a.

Referring to FIG. 1, an interlayer dielectric layer 150 is disposed on the second gate electrode 122. The interlayer dielectric layer 150 can be made of an insulating material.

A source electrode 161 and a drain electrode 162 are disposed on the interlayer dielectric layer 150. The source electrode 161 and the drain electrode 162 are spaced apart from each other and connected with the active layer 140.

Referring to FIG. 1, the source electrode 161 is connected with the first connection portion 140b through a contact hole formed in the interlayer dielectric layer 150, and the drain electrode 162 is connected with the second connection portion 140c through another contact hole formed in the interlayer dielectric layer 150. The first connection portion 140b connected with the source electrode 161 can be referred to as a source connection portion of the active layer 140, and the second connection portion 140c connected with the drain electrode 162 can be referred to as a drain connection portion of the active layer 140.

According to one embodiment of the present disclosure, the first connection portion 140b and the second connection portion 140c can be formed by the selective conductorization of the active layer 140. For example, the active layer 140 can selectively be conductorized by doping using a dopant, whereby the first connection portion 140b and the second connection portion 140c can be formed.

For doping, at least one of boron (B) ions, phosphorus (P) ions or fluorine (F) ions can be used.

According to one embodiment of the present disclosure, the first connection portion 140b can be a drain connection portion, and the second connection portion 140c can be a source connection portion. In addition, any one of the first connection portion 140b and the second connection portion 140c can be a source electrode, and the other one of the first connection portion 140b and the second connection portion 140c can be a drain electrode.

The first connection portion 140b and the second connection portion 140c can serve as lines.

Hereinafter, the channel portion 140a of the active layer 140 will be described in more detail with reference to FIG. 2.

According to one embodiment of the present disclosure, the channel portion 140a overlaps at least one of the first gate electrode 121 and the second gate electrode 122. When all areas of the channel portion 140a overlap at least one of the first gate electrode 121 and the second gate electrode 122, continuity of the channel portion 140a can be ensured, for example, from one end of the channel portion 140a, for example, a left side of the channel portion 140a shown in FIG. 2, to the other end of the channel portion 140a, for example, a right side of the channel portion 140a shown in FIG. 2 (e.g., all portions of the channel portion 140a can be overlapped by at least one of the first gate electrode 121 or the second gate electrode 122, allowing for full coverage of the channel).

Referring to FIGS. 1 and 2, at least a portion of the first gate electrode 121 does not overlap the second gate electrode 122, and at least a portion of the second gate electrode 122 does not overlap the first gate electrode 121.

Due to the arrangement of the first gate electrode 121 and the second gate electrode 122, at least a portion of the channel portion 140a overlaps only one of the first gate electrode 121 and the second gate electrode 122, and another portion of the channel portion 140 overlaps only the other one of the first gate 121 electrode and the second gate electrode 122. Also, the channel portion 140a can include a middle portion that overlaps with both of the first and second gate electrodes 121, 122.

In more detail, referring to FIG. 2, the channel portion 140a of the active layer 140 according to one embodiment of the present disclosure includes a first channel area a1 that is overlapped with the first gate electrode 121 but is not overlapped with the second gate electrode 122, and a second channel area a2 that is overlapped with the second gate electrode 122 but is not overlapped with the first gate electrode 121.

As a result, the first channel area a1 of the channel portion 140a is driven by the first gate electrode 121, and the second channel area a2 of the channel portion 140a is driven by the second gate electrode 122. The first channel area a1 of the channel portion 140a is an area affected by the first gate electrode 121 and the second channel area a2 of the channel portion 140a is affected by the second gate electrode 122.

Referring to FIG. 2, the first channel area a1 is positioned at one end of the channel portion 140a, and the second channel area a2 is positioned at the other end of the channel portion 140a. According to one embodiment of the present disclosure, as shown in FIG. 2, the first connection portion 140b can be in contact with the first channel area a1, and the second connection portion 140c can be in contact with the second channel area a2.

Referring to FIGS. 1 and 2, the first connection portion 140b does not overlap the second gate electrode 122, and the second connection portion 140c does not overlap the first gate electrode 121. According to one embodiment of the present disclosure, at least a portion of the first connection portion 140b can overlap the first gate electrode 121. In order to allow the first gate electrode 121 to sufficiently cover the first channel area a1, the first gate electrode 121 can have an area larger than the first channel area a1. As a result, a portion of the first connection portion 140b can overlap with the first gate electrode 121. Although a portion of the first connection portion 140b overlaps the first gate electrode 121, the first connection portion 140b is conductorized, and thus does not serve as a channel for the thin film transistor 100. Therefore, even though there is an area where the first connection portion 140b overlaps with the first gate electrode 121, driving of the thin film transistor 100 is not affected by the overlap area.

On the other hand, according to one embodiment of the present disclosure, the first connection portion 140b may not overlap the second gate electrode 122. The second gate electrode 122 is a portion of a pattern used as a mask during the selective conductorization process of the active layer 140. Therefore, the second gate electrode 122 may not overlap the first connection portion 140b and the second connection portion 140c.

According to one embodiment of the present disclosure, a portion of the first gate electrode 121 and a portion of the second gate electrode 122 can overlap each other. Therefore, a portion of the channel portion 140a (e.g., a3) can overlap with both of the first gate electrode 121 and the second gate electrode 122.

According to one embodiment of the present disclosure, the channel portion 140a can include a third channel area a3 overlapped with both the first gate electrode 121 and the second gate electrode 122. The third channel area a3 is an area affected by both the first gate electrode 121 and the second gate electrode 122.

In order to help ensure continuity of the channel portion 140a, all portions of the channel portion 140a should overlap with at least one of the first gate electrode 121 or the second gate electrode 122, and the first gate electrode 121 and the second gate electrode 122 can be designed to partially overlap each other in consideration of a process error in the manufacturing process of the first gate electrode 121 and the second gate electrode 122. According to one embodiment of the present disclosure, a length of the third channel area a3 can be designed as small as possible.

When the third channel area a3 exists in the channel portion 140a, continuity of the channel portion 140a can be ensured from one end of the channel portion 140a all the way to the other end of the channel portion 140a.

According to one embodiment of the present disclosure, the active layer 140 includes a first active layer 141 and a second active layer 142 on the first active layer 141. Referring to FIGS. 1 and 2, the first active layer 141 is disposed on the first gate insulating layer 131, and the second active layer 142 is disposed on the first active layer 141. The first active layer 141 and the second active layer 142 are oxide semiconductor material layers, respectively. The oxide semiconductor material constituting the first active layer 141 and the second active layer 142 can include metal and oxygen. According to one embodiment of the present disclosure, the first active layer 141 and the second active layer 142 can have the same metal composition. According to one embodiment of the present disclosure, the first active layer 141 and the second active layer 142 have the same metal composition, and can be distinguished from each other by a difference in the content of at least one of oxygen and hydrogen.

According to one embodiment of the present disclosure, any one of the first active layer 141 and the second active layer 142 has a higher hydrogen concentration and a lower oxygen concentration than the other one of the first active layer 141 and the second active layer 142.

For example, the first active layer 141 can have a hydrogen concentration higher than that of the second active layer 142, and can have an oxygen concentration lower than that of the second active layer 142. The second active layer 142 can have a hydrogen concentration lower than that of the first active layer 141, and can have an oxygen concentration higher than that of the first active layer 141.

According to one embodiment of the present disclosure, the first active layer 141 includes an excess of hydrogen (H) compared with the second active layer 142. The first active layer 141 can be an excess hydrogen layer having a higher hydrogen concentration than a conventional oxide semiconductor material layer used as a channel of the thin film transistor.

When the first active layer 141 includes an excess of hydrogen, a hole trap effect occurs due to an ionization effect of hydrogen (H), whereby a threshold voltage of the thin film transistor 100 can move in a negative (−) direction. Therefore, the threshold voltage Vth can be shifted to the negative (−) direction.

According to one embodiment of the present disclosure, the second active layer 142 includes an excess of oxygen (O) compared with the first active layer 141. The second active layer 142 can be an excess oxygen layer having an oxygen concentration higher than that of a conventional oxide semiconductor material used as a channel of the thin film transistor.

When the second active layer 142 includes an excess of oxygen, an electron trap effect occurs, whereby the threshold voltage of the thin film transistor 100 can move in a positive (+) direction. Therefore, the threshold voltage Vth can be shifted to the positive (+) direction.

The thin film transistor 100 according to one embodiment of the present disclosure can simultaneously have a negative (−) shift effect of the threshold voltage Vth due to the layer containing excess hydrogen and a positive (+) shift effect of the threshold voltage Vth due to a layer containing excess oxygen, thereby suppressing a change in the threshold voltage Vth of the thin film transistor 100 even with passage of time.

In one embodiment of the present disclosure, the situation that the oxide semiconductor material layer has "excess oxygen" means that an oxygen ratio is higher than that when metal and oxygen, which constitute the oxide semiconductor, form a stable chemical bonding in a stoichiometry manner.

A situation that In, Ga and Zn are contained in an IGZO(InGaZnO)-based oxide semiconductor at a ratio of 1:1:1 will be described by way of example.

Indium (In) can be combined with oxygen in a state of $In_2O_3$. Gallium (Ga) can be combined with oxygen in a state of $Ga_2O_3$. In addition, zinc (Zn) can be combined with oxygen in a state of ZnO. Therefore, when a stoichiometric ratio of In, Ga and Zn is 1:1:1, a stoichiometric ratio of oxygen corresponding thereto is 1.5:1.5:1. As a result, when In, Ga and Zn are used at a ratio of 1:1:1, the stoichiometric ratio of oxygen becomes 4. In this situation, a stoichiometric ratio of In, Ga, Zn and O is 1:1:1:4 (In:Ga:Zn:O=1:1:1:4), and the stoichiometric ratio of oxygen can be 4. Therefore, the situation that the oxide semiconductor material layer has an "excess oxygen" means that the stoichiometric ratio of oxygen exceeds 4 when the stoichiometric ratio of In, Ga and Zn is 1:1:1. This can be expressed by the following Equation 1.

$$InGaZnO_{4+x} \text{ (where, } x>0\text{)} \quad (1)$$

Generally, excess hydrogen can be described as an oxygen-deficient portion. For example, in an oxide semiconductor layer in which the stoichiometric ratio of In, Ga and Zn is 1:1:1, when the stoichiometric content of oxygen is less than 4, it can be described as the oxygen-deficient state. The oxygen-deficient state can be described, for example, by Equation 2.

$$InGaZnO_{4-y} \text{ (where, } y>0\text{)} \quad (2)$$

Generally, a gap resulting from the lack of oxygen in the oxide semiconductor layer can be filled by hydrogen (H). The situation that the oxide semiconductor material layer has "excess hydrogen" means that the oxide semiconductor contains more hydrogen than a stable oxygen deficiency state. According to one embodiment of the present disclosure, when the content of hydrogen is at least twice more than the oxygen deficiency, the oxide semiconductor layer can be referred to as an excess of hydrogen state. In more detail, in Equation 2, when the stoichiometric content of hydrogen is 2y or more, the oxide semiconductor layer can be referred to as an excess of hydrogen state.

Referring to FIG. 2, the first channel area a1 of the channel portion 140a is driven by the first gate electrode 121, and the first active layer 141 in the first channel area a1 is disposed to be closer to the first gate electrode 121 than the second active layer 142. Therefore, driving of the first channel area a1 of the channel portion 140a is mainly affected by the first active layer 141. As a result, when the first active layer 141 has a higher hydrogen concentration and a lower oxygen concentration than the second active layer 142, the first channel area a1 can serve to allow the threshold voltage of the thin film transistor 100 to move in the negative (−) direction.

The second channel area a2 of the channel portion 140a is driven by the second gate electrode 122, and the second active layer 142 in the second channel area a2 is disposed to be closer to the second gate electrode 122 than the first active layer 141. Therefore, driving of the second channel area a2 of the channel portion 140a is mainly affected by the second active layer 142. As a result, when the second active layer 142 has a higher oxygen concentration and a lower hydrogen concentration than the first active layer 141, the second channel area a2 can serve to allow the threshold voltage of the thin film transistor 100 to move in the positive (+) direction.

As described above, the channel portion 140a of the thin film transistor 100 according to one embodiment of the present disclosure includes a first channel area a1 serving to shift the threshold voltage in the negative (−) direction and a second channel area a2 serving to shift the threshold voltage Vth in the positive (+) direction. Therefore, in the thin film transistor 100 according to one embodiment of the present disclosure, the shift effect of the threshold voltage Vth in the negative (−) direction and the shift effect of the threshold voltage Vth in the positive (+) direction are counterbalanced, whereby a change in the threshold voltage Vth can be suppressed. Therefore, the thin film transistor 100 according to one embodiment of the present disclosure can stably be driven without a large change in the threshold voltage Vth. In particular, even in the situation that the thin film transistor is driven in an ON-state for a long time, the thin film transistor can stably be driven without change of the threshold voltage. For example, due to this unique design, the embodied invention can effectively pin the threshold voltage Vth to a specific value and keep it there, even after the device has been used for a long time.

Figure 4A:
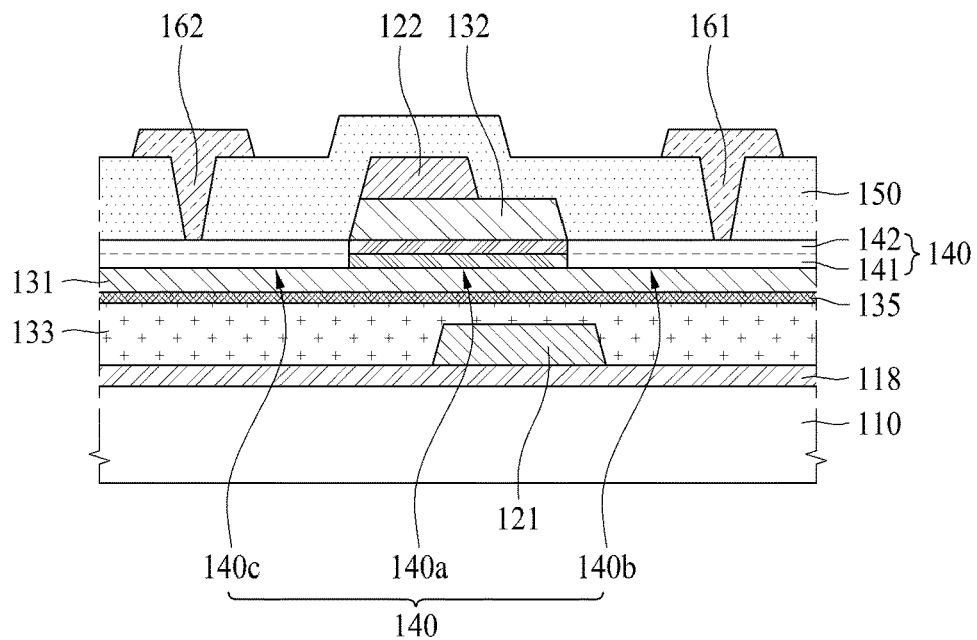
FIGS. 4A and 4B are cross-sectional views illustrating thin film transistors according to still another embodiment of the present disclosure.
Figure 4B:
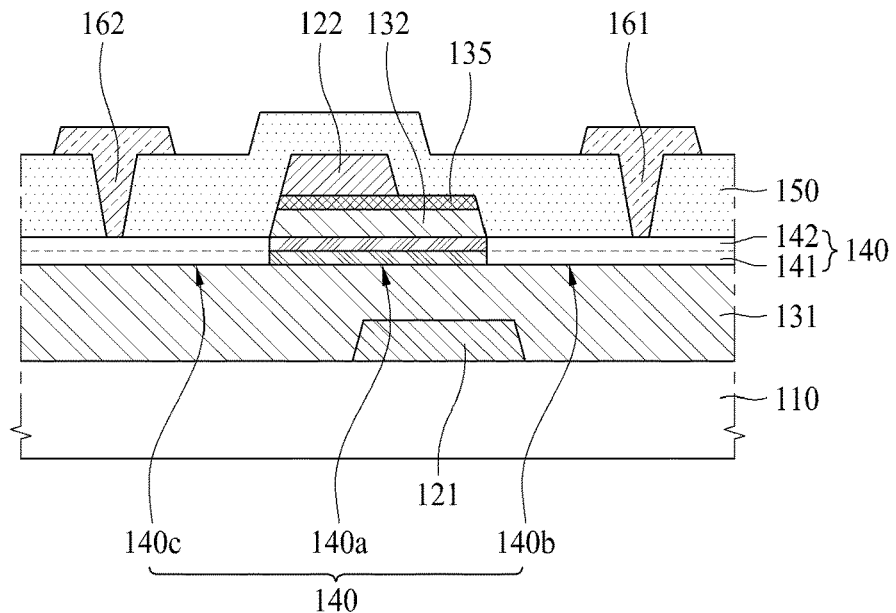
Figure 5A:
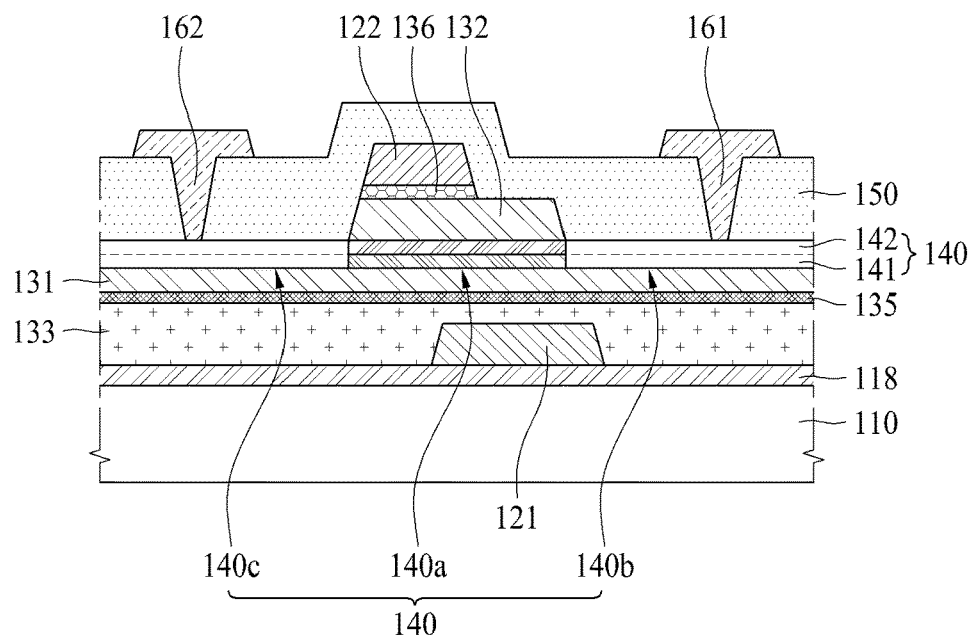
FIGS. 5A and 5B are cross-sectional views illustrating a thin film transistor according to further still another embodiment of the present disclosure, respectively.
Figure 5B:
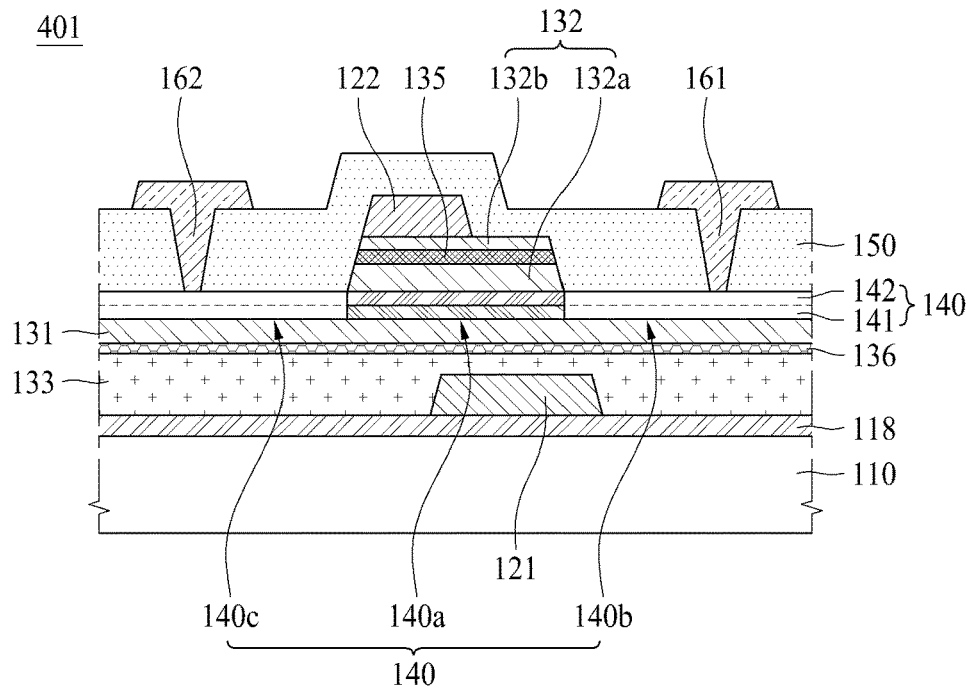

However, one embodiment of the present disclosure is not limited to the above example, and the first active layer 141 can have a lower hydrogen concentration and a higher oxygen concentration than the second active layer 142, and the second active layer 142 can have a higher hydrogen concentration and a lower oxygen concentration than the first active layer 141 (e.g., refer to FIGS. 4B and 5B).

Referring to FIG. 2, the first channel area a1 of the channel portion 140a is driven by the first gate electrode 121, and the first active layer 141 included in the first channel area a1 is disposed to be closer to the first gate electrode 121 than the second active layer 142. Therefore, driving of the first channel area a1 of the channel portion 140a is mainly affected by the first active layer 141. As a result, when the first active layer 141 has a lower hydrogen concentration and a higher oxygen concentration than the second active layer 142, the first channel area a1 can serve to allow the threshold voltage of the thin film transistor 301 or 401 to move in the positive (+) direction.

The second channel area a2 of the channel portion 140a is driven by the second gate electrode 122, and the second active layer 142 included in the second channel area a2 is disposed to be closer to the second gate electrode 122 than the first active layer 141. Therefore, the second channel area a2 of the channel portion 140a is mainly affected by the second active layer 142. As a result, when the second active layer 142 has a higher hydrogen concentration and a lower oxygen concentration than the first active layer 141, the second channel area a2 can serve to allow the threshold voltage of the thin film transistor 301 or 401 to move in the negative (−) direction.

As described above, the channel portion 140a of the thin film transistor 301 or 401 according to one embodiment of the present disclosure includes both a first channel area a1 serving to shift the threshold voltage Vth in the positive (+) direction and a second channel area a2 serving to shift the threshold voltage Vth in the negative (−) direction (refer to FIGS. 4B and 5B). Therefore, in the thin film transistor 301 or 401 according to one embodiment of the present disclosure, the shift effect of the threshold voltage Vth in the positive (+) direction and the shift effect of the threshold voltage Vth in the negative (−) direction are counterbalanced, whereby a change in the threshold voltage Vth can be suppressed. Therefore, the thin film transistor 301 or 401 according to one embodiment of the present disclosure can stably be driven without a large change in the threshold voltage Vth.

As described above, according to one embodiment of the present disclosure, the first active layer 141 can have a higher hydrogen concentration and a lower oxygen concentration than the second active layer 142, and the first active layer 141 can have a lower hydrogen concentration and a higher oxygen concentration than the second active layer 142. Due to the difference between the hydrogen concentration and the oxygen concentration of the first active layer 141 and the second active layer 142 and the arrangement property of the first gate electrode 121 and the second gate electrode 122, the thin film transistor 100 according to one embodiment of the present disclosure can have excellent stability without a change in the threshold voltage Vth.

The hydrogen concentration and the oxygen concentration of the first active layer 141 and the second active layer 142 can be adjusted in various ways.

For example, the material used in the manufacturing process of the first active layer 141 and the second active layer 142 can appropriately be selected so that the hydrogen concentration and the oxygen concentration of the first active layer 141 and the second active layer 142 can be adjusted.

According to one embodiment of the present disclosure, the first active layer 141 and the second active layer 142 can be formed by a metal-organic chemical vapor deposition (MOCVD) method. At this time, the hydrogen concentration and the oxygen concentration of the first active layer 141 and the second active layer 142 can be adjusted by adjusting the content of hydrogen gas ($H_2$) or ozone ($O_3$), which is used in the MOCVD method.

The hydrogen concentration and the oxygen concentration of the first active layer 141 and the second active layer 142 can be adjusted by disposing a hydrogen supply layer in the vicinity of the first active layer 141 or the second active layer 142 or by treating the first active layer 141 or the second active layer 142 with an oxygen treatment, for example, with $N_2O$ gas.

Figure 3:
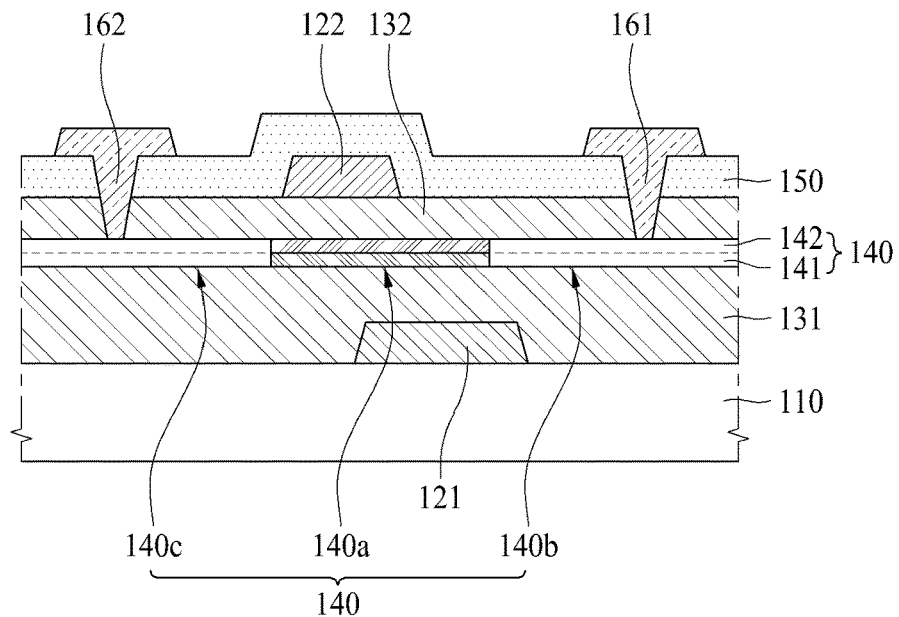
FIG. 3 is a cross-sectional view illustrating a thin film transistor according to another embodiment of the present disclosure.

FIG. 3 is a cross-sectional view illustrating a thin film transistor 200 according to another embodiment of the present disclosure. Hereinafter, the description of the elements already described will be omitted in order to avoid redundancy.

Referring to FIG. 3, the second gate insulating layer 132 can cover the entire upper surface of the active layer 140. In FIG. 3, the surface of the active layer 140 toward the second gate electrode 122 is referred to as an upper surface. According to another embodiment of the present disclosure, the second gate insulating layer 132 may not be patterned.

Referring to FIG. 3, a contact hole can be formed in the second gate insulating layer 132.

According to another embodiment of the present disclosure, the source electrode 161 can be connected with the first connection portion 140b of the active layer 140 through a contact hole formed in the interlayer dielectric layer 150 and the second gate insulating layer 132. The drain electrode 162 can be connected with the second connection portion 140c of the active layer 140 through another contact hole formed in the interlayer dielectric layer 150 and the second gate insulating layer 132.

FIG. 4A is a cross-sectional view illustrating a thin film transistor 300 according to still another embodiment of the present disclosure. The thin film transistor 300 according to another embodiment of the present disclosure includes a hydrogen supply layer 135 disposed between the first gate electrode 121 and the active layer 140.

Referring to FIG. 4A, a buffer layer 118 can be disposed on a substrate 110. The buffer layer 118 can include at least one of a silicon oxide or a silicon nitride. The buffer layer 118 can protect the active layer 140, and can have a planarization property to planarize an upper portion of the substrate 110.

The first gate electrode 121 is disposed on the buffer layer 118, and a first passivation layer 133 is disposed on the first gate electrode 121. The first passivation layer 133 can serve to insulate and protect the first gate electrode 121. The first passivation layer 133 can be made of the same material as that of the first gate insulating layer 131.

The hydrogen supply layer 135 is disposed on the first passivation layer 133. The hydrogen supply layer 135 supplies hydrogen to the active layer 140. As a result, the first active layer 141 containing hydrogen having a higher concentration than the second active layer 142 can be formed. The first active layer 141 contains hydrogen at a concentration higher than a typical hydrogen concentration of the oxide semiconductor layer. The first active layer 141 according to another embodiment of the present disclosure is an excess hydrogen layer containing excess hydrogen.

The hydrogen supply layer 135 can be formed by, for example, a silicon nitride (SiNx). The silicon nitride (SiNx) layer used as the hydrogen supply layer 135 can include hydrogen of a high concentration.

The first gate insulating layer 131 is disposed on the hydrogen supply layer 135. The first gate insulating layer 131 can have insulation properties, and can include at least one of a silicon oxide, a silicon nitride or a metal-based oxide. The first gate insulating layer 131 can be formed of the same material as that of the first passivation layer 133. The first gate insulating layer 131 and the first passivation layer 133 can collectively be referred to as a first gate insulating layer or a lower gate insulating layer.

The active layer 140 is disposed on the first gate insulating layer 131, and the second gate insulating layer 132 is disposed on the active layer 140.

The second gate electrode 122 is disposed on the second gate insulating layer 132, and the interlayer dielectric layer 150 is disposed on the second gate electrode 122. The source electrode 161 and the drain electrode 162 are disposed on the interlayer dielectric layer 150.

However, still another embodiment of the present disclosure is not limited to the configuration shown in FIG. 4A. According to still another embodiment of the present disclosure, the hydrogen supply layer 135 can be disposed over the active layer 140. For example, the hydrogen supply layer 135 can be disposed in the second gate insulating layer 132, or can be disposed in the interlayer dielectric layer 150.

FIG. 4B is a cross-sectional view illustrating a thin film transistor 301 according to still another embodiment of the present disclosure.

Referring to FIG. 4B, the hydrogen supply layer 135 can be disposed on the second gate insulating layer 132. When the hydrogen supply layer 135 is disposed over the active layer 140 as described in FIG. 4B, the second active layer 142 can include an excess of hydrogen.

FIG. 5A is a cross-sectional view illustrating a thin film transistor according to further still another embodiment of the present disclosure. The thin film transistor 400 of FIG. 5A further includes an oxygen supply layer 136 as compared with the thin film transistor 300 of FIG. 4A.

Referring to FIG. 5A, in detail, the thin film transistor 400 according to still another embodiment of the present disclosure includes the oxygen supply layer 136 disposed between the active layer 140 and the second gate electrode 122. The oxygen supply layer 136 supplies oxygen to the active layer 140. As a result, the second active layer 142 containing oxygen with a concentration higher than that of the first active layer 141 can be formed. The second active layer 142 can include oxygen with a concentration higher than the oxygen concentration of the typical oxide semiconductor layer. The second active layer 142 according to still another embodiment of the present disclosure is an excess oxygen layer containing an excess of oxygen.

FIG. 5B is a cross-sectional view illustrating a thin film transistor according to further still another embodiment of the present disclosure. The thin film transistor 401 of FIG. 5B includes a hydrogen supply layer 135 and an oxygen supply layer 136.

Referring to FIG. 5B, the oxygen supply layer 136 can be disposed on the first passivation layer 133. The oxygen supply layer 136 can supply oxygen to the lower portion of the active layer 140. As a result, the first active layer 141 can have higher oxygen concentration than the second active layer 142.

The first gate insulating layer 131 is disposed on the oxygen supply layer 136, and the active layer 140 is disposed on the first gate insulating layer 131. The second gate insulating layer 132 is disposed on the active layer 140, and the second gate electrode 122 is disposed on the second gate insulating layer 132.

Referring to FIG. 5B, the hydrogen supply layer 135 can be disposed in the second gate insulating layer 132. The hydrogen supply layer 135 can supply hydrogen to the upper portion of the active layer 140. As a result, the second active layer 142 can have higher hydrogen concentration than the first active layer 141. The second gate insulating layer 132 can be divided into a lower layer 132a and an upper layer 132b based on the hydrogen supply layer 135. For example, the hydrogen supply layer 135 can be disposed between the lower layer 132a and the upper layer 132b of the second gate insulating layer 132.

In the thin film transistor 401 shown in FIG. 5B according to further still another embodiment of the present disclosure, the first active layer 141 can have higher oxygen concentration than the second active layer 142, and the second active layer 142 can have higher hydrogen concentration than the first active layer 141.

Figure 6:
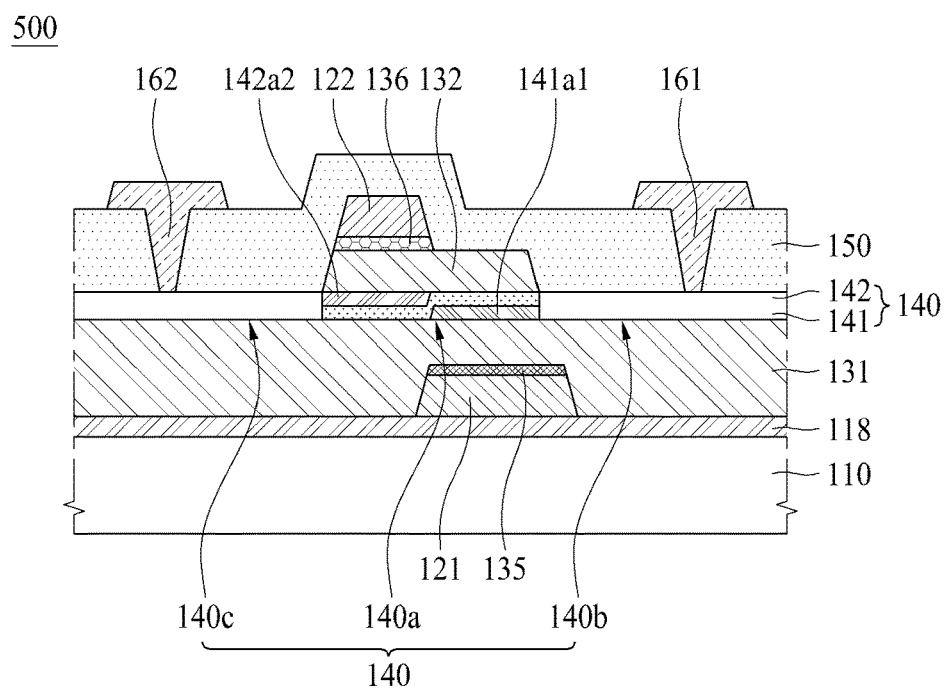
FIG. 6 is a cross-sectional view illustrating a thin film transistor according to further still another embodiment of the present disclosure.

FIG. 6 is a cross-sectional view illustrating a thin film transistor 500 according to further still another embodiment of the present disclosure.

Referring to FIG. 6, the hydrogen supply layer 135 is disposed on the first gate electrode 121. The hydrogen supply layer 135 supplies hydrogen to a predetermined area of the active layer 140. As a result, a first area 141a1 positioned above the hydrogen supply layer 135 of the first active layer 141 can have a higher hydrogen concentration than other areas.

In more detail, the first active layer 141 has a first area 141a1 overlapped with the first gate electrode 121, in which the first area 141a1 has a higher hydrogen concentration than the other areas of the first active layer 141.

Referring to FIG. 6, the second active layer 142 can have a second area 142a2. The second area 142a2 of the second active layer 142 overlaps the second gate electrode 122. The second area 142a2 can have an oxygen concentration higher than that of the other areas of the second active layer 142.

For example, according to further still another embodiment of the present disclosure, the second active layer 142 can selectively be oxygen-treated to form the second area 142a2 in the second active layer 142.

Referring to FIG. 6, the thin film transistor 500 according to further still another embodiment of the present disclosure has an oxygen supply layer 136 disposed between the second gate insulating layer 132 and the second gate electrode 122. The oxygen supply layer 136 can supply oxygen to the second active layer 142 to form the second area 142a2 in the second active layer 142. For example, oxygen and hydrogen can be concentrated at opposite corners/sides of the channel portion 140a of the thin film transistor.

Figure 7:
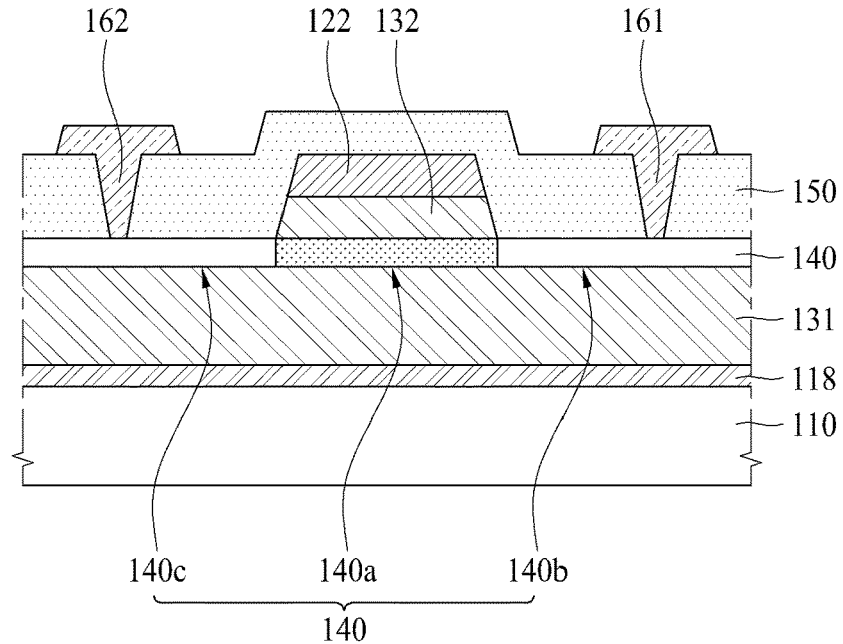
FIGS. 7 and 8 are cross-sectional views illustrating thin film transistors according to comparative examples.
Figure 8:
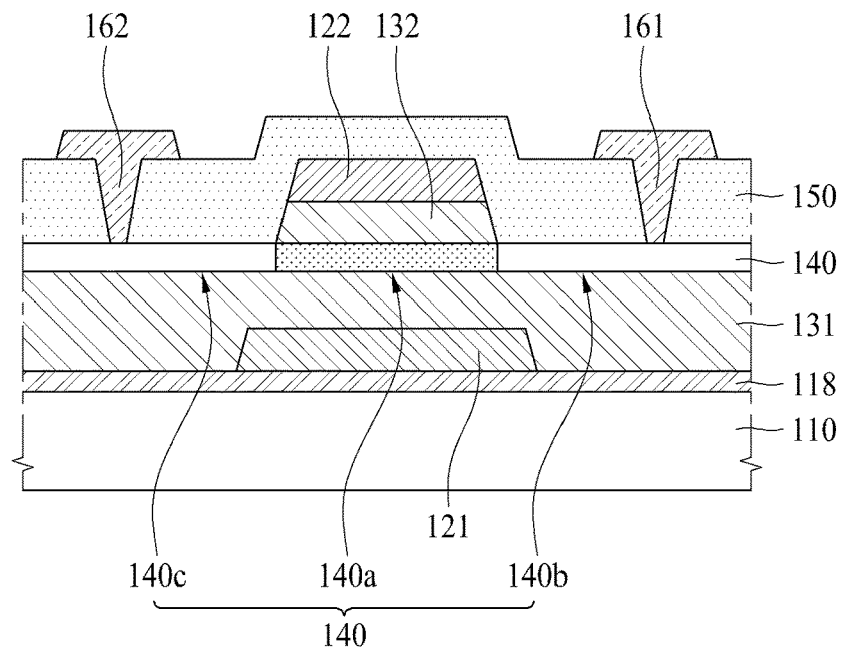

FIGS. 7 and 8 are cross-sectional views illustrating a thin film transistor according to comparative examples. Hereinafter, the thin film transistor shown in FIG. 7 will be referred to as Comparative Example 1, and the thin film transistor shown in FIG. 8 will be referred to as Comparative Example 2.

As shown in FIG. 7, the thin film transistor according to Comparative Example 1 does not include the first gate electrode 121, and includes only the second gate electrode 122. The thin film transistor shown in FIG. 7 is also referred to as a thin film transistor of a top gate structure.

The channel portion 140a of the thin film transistor shown in FIG. 7 overlaps only one gate electrode. Therefore, the thin film transistor shown in FIG. 7 does not include a configuration in which a portion of the channel portion 140a overlaps only one of the first gate electrode 121 and the second gate electrode 122 and another portion of the channel portion 140a overlaps only the other one of the first gate electrode 121 and the second gate electrode 122.

The thin film transistor according to Comparative Example 2 shown in FIG. 8 includes both the first gate electrode 121 and the second gate electrode 122. The thin film transistor shown in FIG. 8 is also referred to as a thin film transistor of a double gate structure.

In the thin film transistor shown in FIG. 8, the entire areas of the channel portion 140a overlap the first gate electrode 121 and the second gate electrode 122. Therefore, the thin film transistor shown in FIG. 8 does not include a configuration in which a portion of the channel portion 140a overlaps only one of the first gate electrode 121 and the second gate electrode 122, and another portion of the channel portion 140a overlaps only the other one of the first gate electrode 121 and the second gate electrode 122.

The thin film transistor having the configuration shown in FIG. 7 or 8 has a change in the threshold voltage Vth over time, which is greater than that of each of the thin film transistors 100, 200, 300, 301, 400, 401 and 500 according to the embodiments of the present disclosure.

Figure 9:
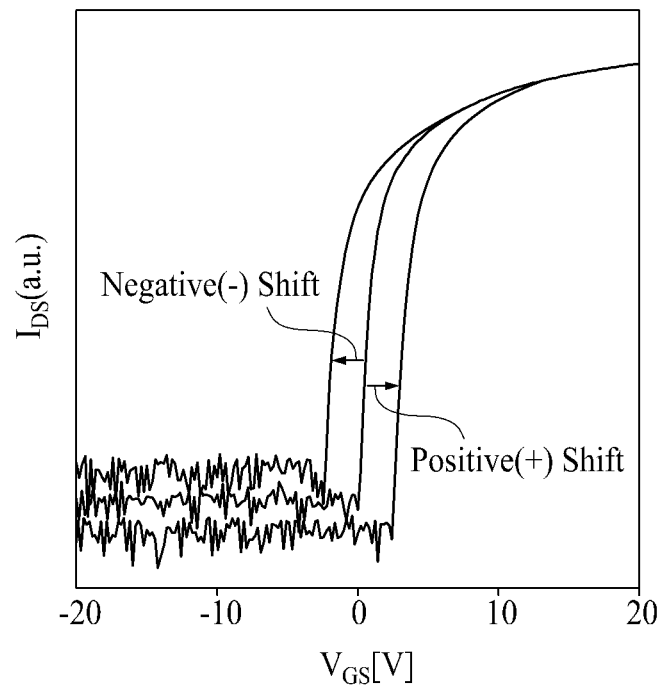
FIG. 9 is a graph illustrating a change of a threshold voltage according to embodiments of the present disclosure.

FIG. 9 is a graph illustrating a change of a threshold voltage Vth.

In the graph at the center of the graphs shown in FIG. 9, a threshold voltage Vth is close to 0V. On the other hand, in a graph at the left side of the graphs shown in FIG. 9, the threshold voltage is shifted in a negative (−) voltage direction. As shown in the graph at the left side of the graphs in FIG. 9, when the threshold voltage is shifted in the negative (−) voltage direction, the threshold voltage Vth is shifted in the negative (−) direction.

In a graph at the right side of the graphs shown in FIG. 9, the threshold voltage is shifted in a positive (+) voltage direction. As shown in the graph at the right side of graphs in FIG. 9, when the threshold voltage is shifted in the positive (+) voltage direction, the threshold voltage Vth is shifted in the positive (+) direction.

Figure 10A:
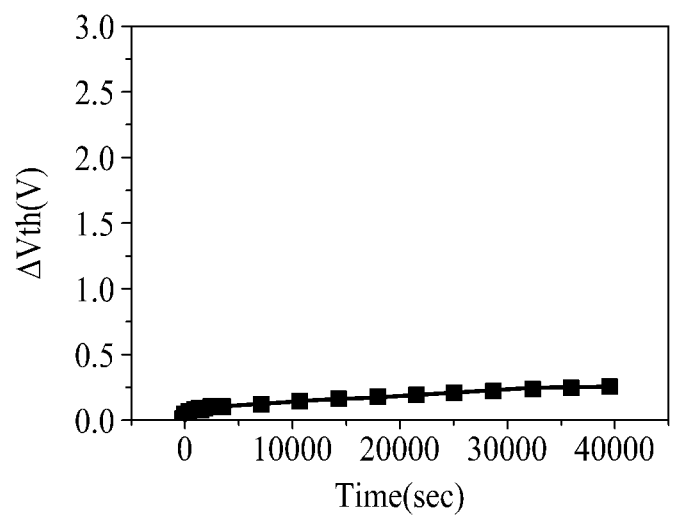
FIGS. 10A, 10B and 10C are graphs illustrating a change of a threshold voltage depending on time according to embodiments of the present disclosure.
Figure 10B:
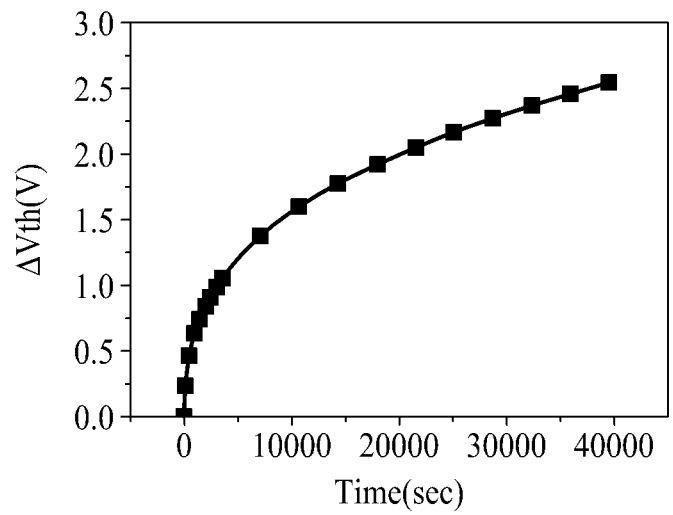
Figure 10C:
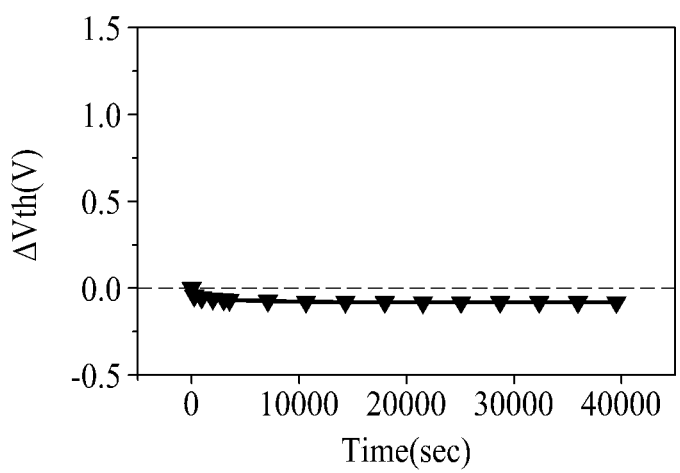

FIGS. 10A, 10B and 10C are graphs illustrating a change of a threshold voltage depending on time. In detail, FIGS. 10A, 10B and 10C represent the results of a positive-bias temperature stress (PBTS) test.

Here, PBTS preferably means stress under conditions in which a positive (+) bias voltage and a constant temperature are applied. When PBTS is increased, stress in the oxide semiconductor layer 120 or the thin film transistor 100 is increased, whereby a change rate ΔVth of the threshold voltage can be increased.

In FIG. 10A, in a state that PBTS is applied to the thin film transistor according to the Comparative Example 1 shown in FIG. 7, the change rate ΔVth of the threshold voltage Vth depending on time is measured. Referring to FIG. 10A, it is noted that the change rate of the threshold voltage Vth is continuously increased as time passes when the PBTS is applied to the thin film transistor (Comparative Example 1) shown in FIG. 7. In the thin film transistor (Comparative Example 1) shown in FIG. 7, it is noted that when the PBTS is applied, the threshold voltage Vth is continuously increased without being converged on a specific value, and the change rate ΔVth of the threshold voltage is 0.254V or so after 40,000 seconds.

In FIG. 10B, in a state that PBTS is applied to the thin film transistor according to the Comparative Example 2 shown in FIG. 8, the change rate ΔVth of the threshold voltage Vth depending on time is measured. Referring to FIG. 10B, it is noted that the change rate of the threshold voltage Vth is continuously increased as time passes when the PBTS is applied to the thin film transistor (Comparative Example 2) shown in FIG. 8. In the thin film transistor (Comparative Example 2) shown in FIG. 8, it is noted that when the PBTS is applied, the threshold voltage Vth is continuously increased without being converged on a specific value, and the change rate ΔVth of the threshold voltage is 2.54V or so after 40,000 seconds.

The thin film transistor according to the Comparative Example 2 shown in FIG. 8 can have an excellent on-current characteristic due to its double gate structure, but has a problem in that the change rate ΔVth of the threshold voltage Vth increases as time passes.

FIG. 10C is a graph illustrating a threshold voltage of the thin film transistor 300 according to another embodiment of the present disclosure shown in FIG. 4A. Referring to FIG. 10C, it is noted that the threshold voltage Vth changes very little even though PBTS is applied to the thin film transistor 300 according to another embodiment of the present disclosure. Thus, the specific type of staggered, double gate configuration of the embodied invention provides a much more stable threshold voltage over time, when compared to the example configurations of FIG. 7 and FIG. 8.

Hereinafter, a method for manufacturing a thin film transistor 300 according to another embodiment of the present disclosure will be described with reference to FIGS. 11A through 11M.

FIGS. 11A to 11M are process views illustrating a method for manufacturing a thin film transistor 300 according to another embodiment of the present disclosure.

Figure 11A:
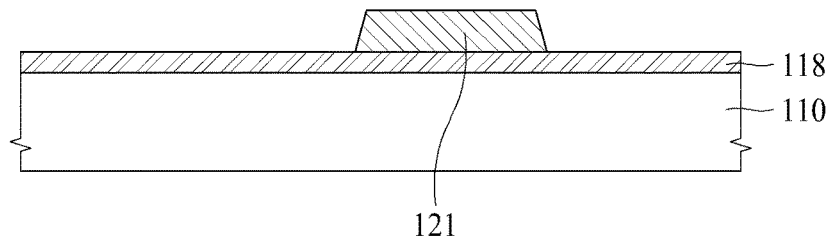
FIGS. 11A to 11M are process views illustrating a method for manufacturing a thin film transistor according to an embodiment of the present disclosure.

Referring to FIG. 11A, a buffer layer 118 is formed on a substrate 110, and a first gate electrode 121 is formed on the buffer layer 118.

Figure 11B:
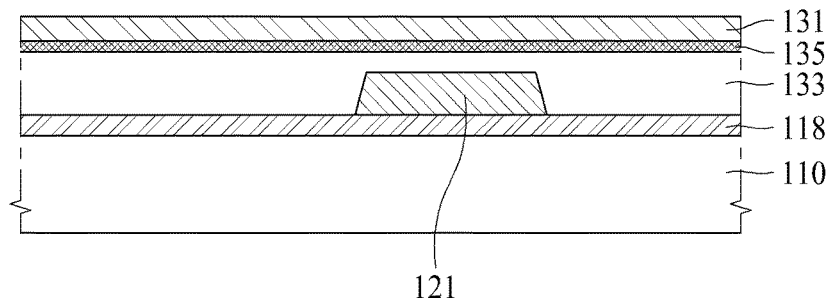

Referring to FIG. 11B, a first passivation layer 133 is formed on the first gate electrode 121, a hydrogen supply layer 135 is formed on the first passivation layer 133, and a first gate insulating layer 131 is formed on the hydrogen supply layer 135.

The first passivation layer 133 can be made of an insulating material. The hydrogen supply layer 135 is a layer for supplying hydrogen to the active layer 140. The hydrogen supply layer 135 can be formed by, for example, a silicon nitride (SiNx). The silicon nitride layer applied to the hydrogen supply layer 135 can include hydrogen of a high concentration. The first gate insulating layer 131 has insulating properties.

Figure 11C:
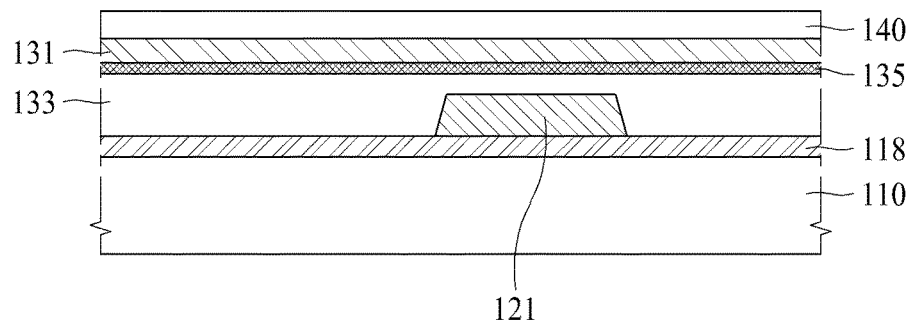

Referring to FIG. 11C, an active layer 140 is formed on the first gate insulating layer 131. The active layer 140 includes an oxide semiconductor material. The active layer 140 can be an oxide semiconductor layer. The active layer 140 can include, for example, at least one of IZO(InZnO)-based, IGO(InGaO)-based, ITO(InSnO)-based, IGZO(InGaZnO)-based, IGZTO(InGaZnSnO)-based, ITZO(In- SnZnO)-based, IGTO(InGaSnO)-based, GO(GaO)-based, GZTO(GaZnSnO)-based or GZO(GaZnO)-based oxide semiconductor material.

Figure 11D:
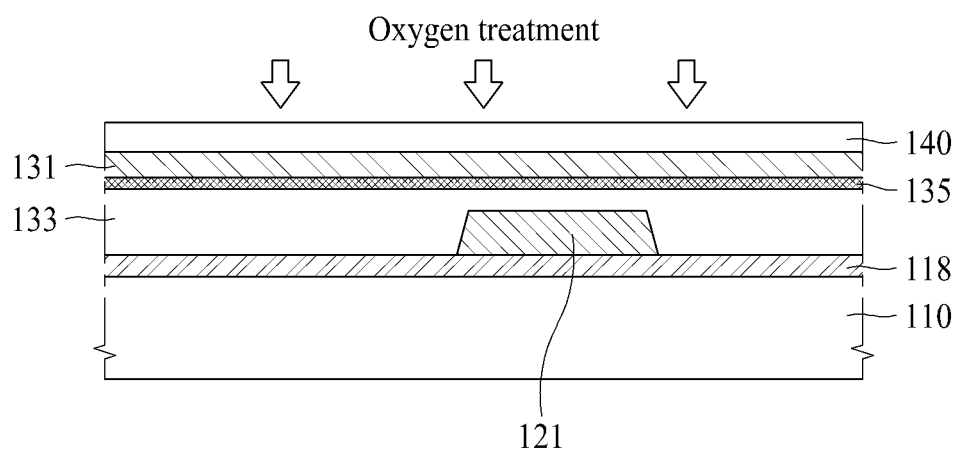

Referring to FIG. 11D, a surface of the active layer 140 is oxygen-treated. The oxygen treatment shown in FIG. 11D can include treating the surface of the active layer 140 with $N_2O$ gas.

Hydrogen is supplied to the active layer 140 by the hydrogen supply layer 135, and oxygen (O) is supplied to the surface of the active layer 140 by oxygen treatment, whereby the first active layer 141 and the second active layer 142 can be formed.

Figure 11E:
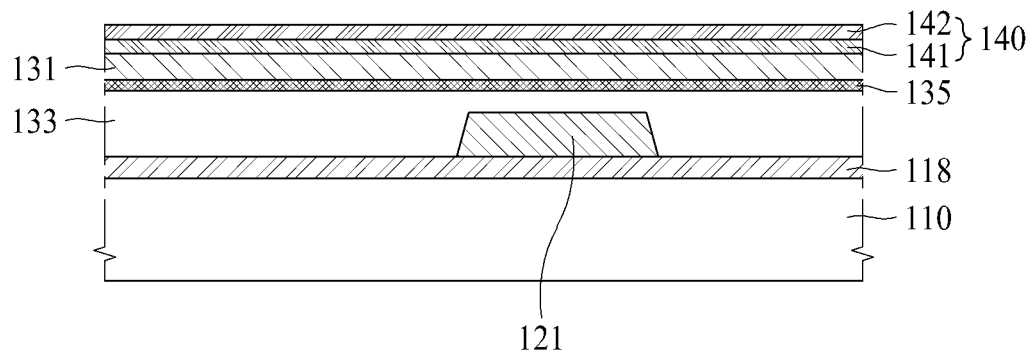

As a result, as shown in FIG. 11E, the active layer 140 including the first active layer 141 and the second active layer 142 is formed. The first active layer 141 can have a higher hydrogen concentration and a lower oxygen concentration than the second active layer 142. Also, the second active layer 142 can have a lower hydrogen concentration and a higher oxygen concentration than the first active layer 141.

However, another embodiment of the present disclosure is not limited to the above example, and the first active layer 141 can have a lower hydrogen concentration and a higher oxygen concentration than the second active layer 142, and the second active layer 142 can have a higher hydrogen concentration and a lower oxygen concentration than the first active layer 141.

For example, the first active layer 141 and the second active layer 142 can be formed by a metal-organic chemical vapor deposition (MOCVD) method. At this time, the hydrogen concentration and the oxygen concentration of the first active layer 141 and the second active layer 142 can be adjusted by adjusting the content of hydrogen gas ($H_2$) or ozone ($O_3$), which is used in the MOCVD method. The first active layer 141 can have a lower hydrogen concentration and a higher oxygen concentration than the second active layer 142 by increasing the amount of ozone ($O_3$) used in forming the first active layer 141 and increasing the amount of hydrogen used in forming the second active layer 142.

Figure 11F:
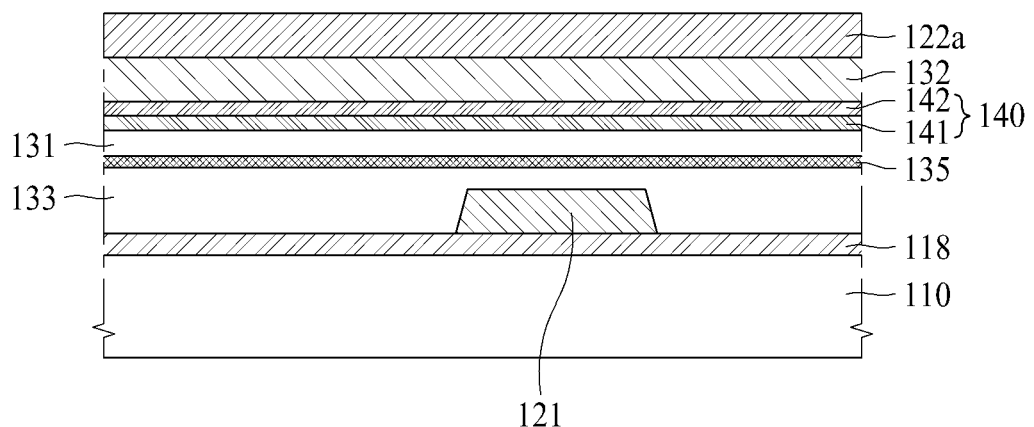

Referring to FIG. 11F, a second gate insulating layer 132 is formed on the active layer 140, and a second gate electrode material layer 122a is formed on the second gate insulating layer 132. The second gate electrode material layer 122a can include at least one of an aluminum-based metal such as aluminum (Al) or aluminum alloy, a silver-based metal such as silver (Ag) or silver alloy, a copper-based metal such as copper (Cu) or copper alloy, a molybdenum-based metal such as molybdenum (Mo) or molybdenum alloy, chromium (Cr), tantalum (Ta), neodymium (Nd) or titanium (Ti). The second gate electrode material layer 122a can have a multi-layered structure that includes at least two conductive layers having their respective physical properties different from each other.

Figure 11G:
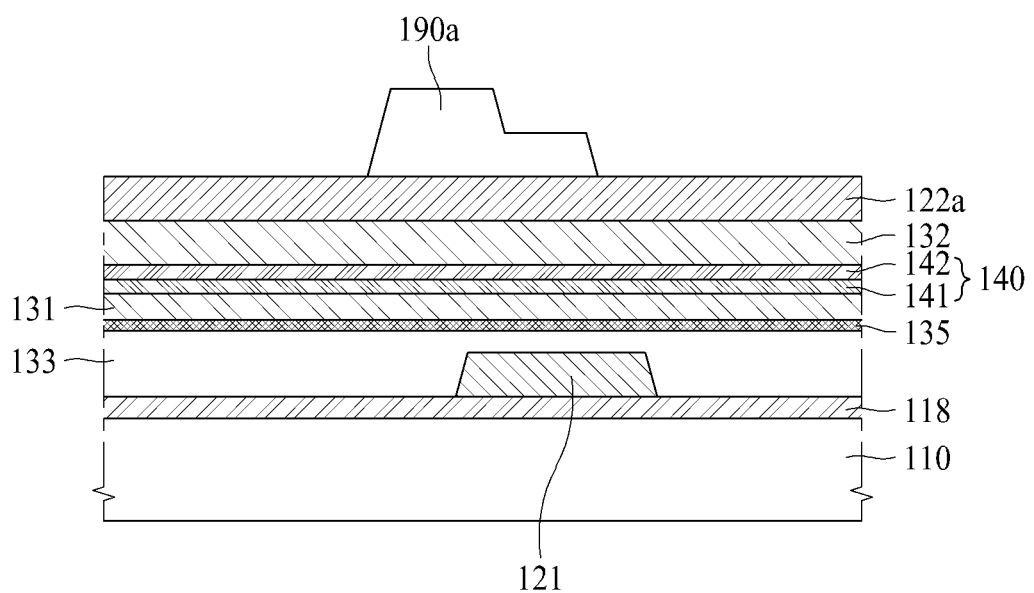

Referring to FIG. 11G, a first photoresist pattern 190a is formed on the second gate electrode material layer 122a. The first photoresist pattern 190a can be formed by exposure and development of photoresist.

Figure 11H:
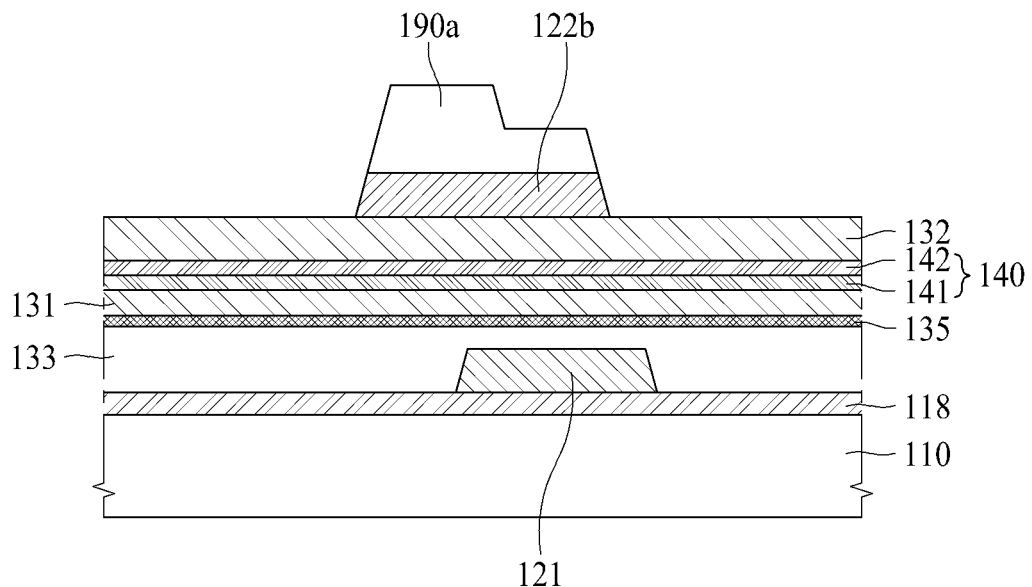

Referring to FIG. 11H, the second gate electrode material layer 122a is etched using the first photoresist pattern 190a as a mask. As a result, a second gate electrode pattern 122b is formed.

Figure 11I:
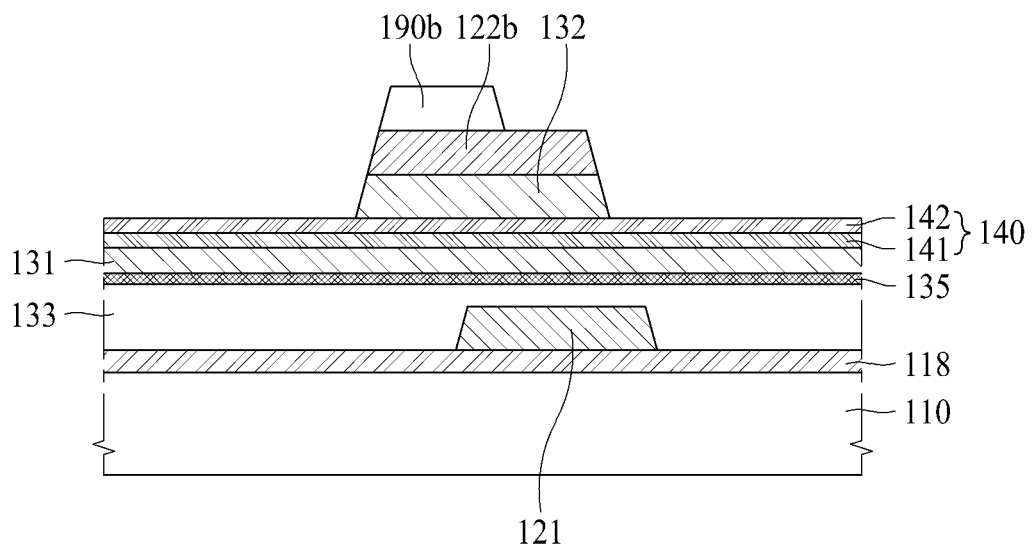

Referring to FIG. 11I, the second gate insulating layer 132 can be patterned by etching using the second gate electrode pattern 122b as a mask. At this time, a portion of the first photoresist pattern 190a is removed to form a second photoresist pattern 190b.

However, another embodiment of the present disclosure is not limited to the above example, and the second gate insulating layer 132 may not be patterned.

Figure 11J:
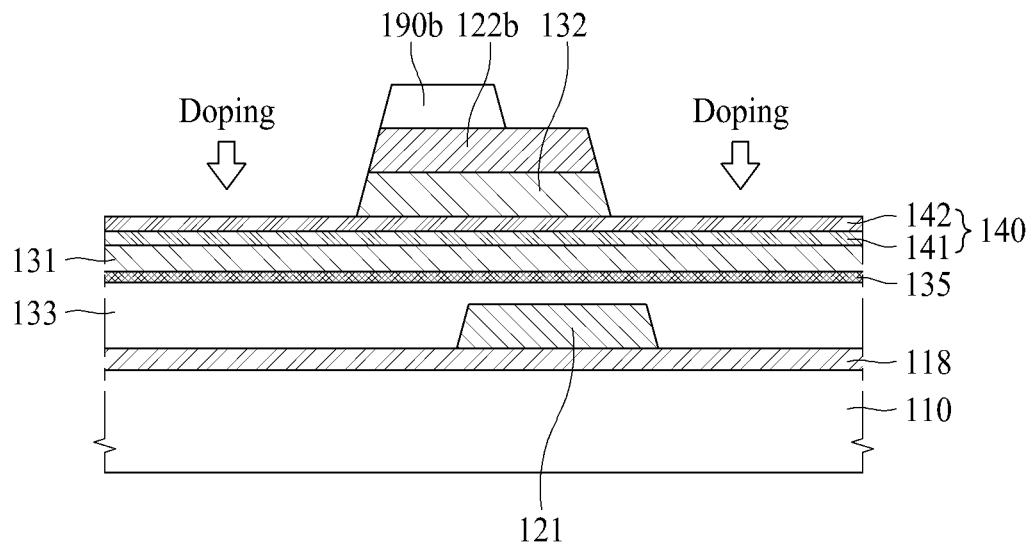

Referring to FIG. 11J, the active layer 140 is selectively conductorized. For example, a dopant can selectively be doped on the active layer 140. FIG. 11J exemplarily illustrates a process in which the active layer 140 is selectively conductorized by doping.

Referring to FIG. 11J, the active layer 140 can selectively be conductorized by doping using the second gate electrode pattern 122b as a mask. An area of the active layer 140, which is not protected by the second gate electrode pattern 122b, is selectively conductorized.

The dopant can include at least one of boron (B), phosphorus (P) or fluorine (F). The dopant can be doped with an ion state. According to one embodiment of the present disclosure, conductorization can be made by ion doping through ion implantation.

Figure 11K:
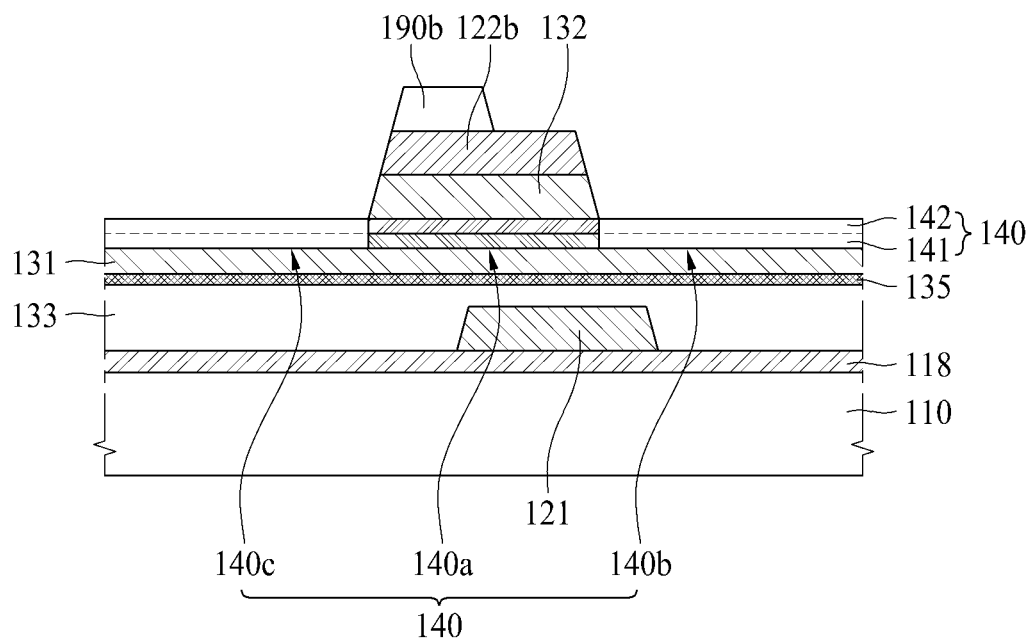

Referring to FIG. 11K, as a result of selective conductorization for the active layer 140 using the second gate electrode pattern 122b as a mask, the first connection portion 140b and the second connection portion 140c are formed. Referring to FIG. 11k, at least a portion of the second connection portion 140c can overlap the first gate electrode 121. In order that the first gate electrode 121 sufficiently covers the first channel area a1, the first gate electrode 121 can have a larger area than the first channel area a1. As a result, a portion of the first connection portion 140b can overlap the first gate electrode 121. Although a portion of the first connection portion 140b overlaps the first gate electrode 121, the first connection portion 140b has been conductorized and thus does not serve as a channel. Therefore, even though there is an area where the first connection portion 140b overlaps the first gate electrode 121, driving of the thin film transistor 300 is not affected by the overlap area According to one embodiment of the present disclosure, the channel portion 140a of the active layer 140 is not conductorized. The second gate electrode pattern 122b serves as a mask for protecting the channel portion 140a during the conductorization process.

Figure 11L:
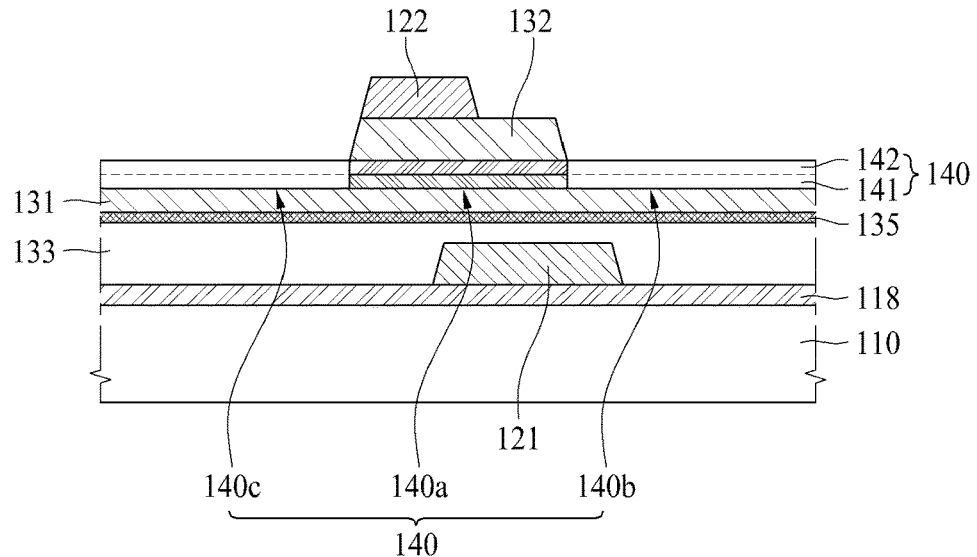

Referring to FIG. 11L, the second gate electrode pattern 122b is etched by etching using the second photoresist pattern 190b as a mask, whereby the second gate electrode 122 is formed. After the second gate electrode 122 is formed, the second photoresist pattern 190b is removed.

According to another embodiment of the present disclosure, at least a portion of the first gate electrode 121 does not overlap the second gate electrode 122, and at least a portion of the second gate electrode 122 is formed so as not to overlap the first gate electrode 121. The first gate electrode 121 can overlap a portion of the second gate electrode 122.

The channel portion 140a is formed to overlap at least one of the first gate electrode 121 or the second gate electrode 122.

In addition, at least a portion of the first gate electrode 121 is formed so as not to overlap the second gate electrode 122, and at least a portion of the second gate electrode 122 is formed so as not to overlap the first gate electrode 121.

According to another embodiment of the present disclosure, the channel portion 140a is designed such that a portion overlaps only one of the first gate electrode 121 and the second gate electrode 122 and another portion overlaps only the other one of the first gate 121 electrode and the second gate electrode 122.

Figure 11M:
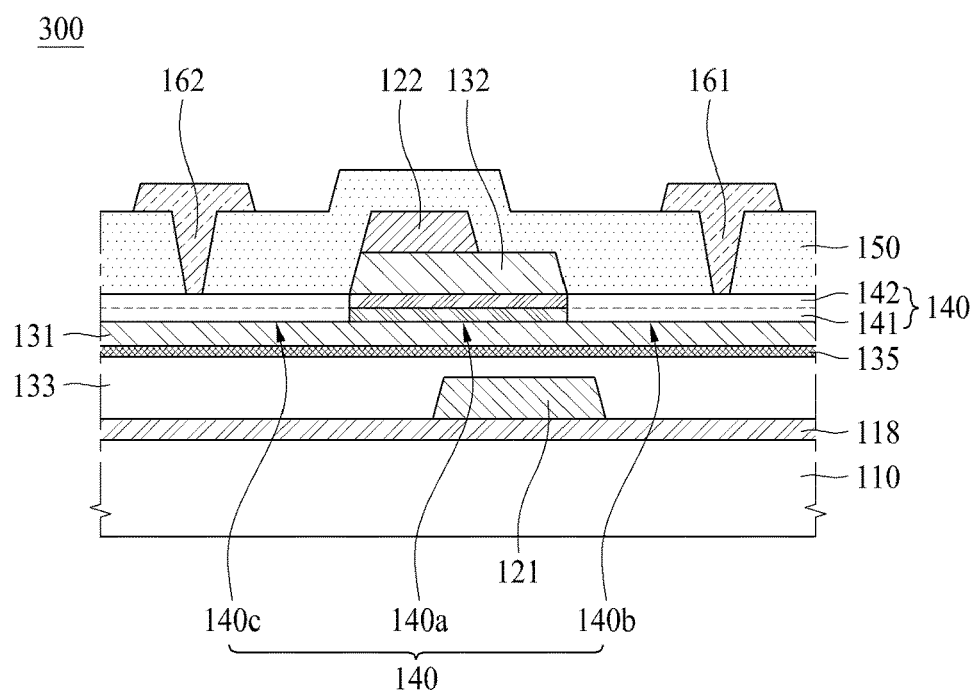

Referring to FIG. 11M, an interlayer dielectric layer 150 is formed on the second gate electrode 122, and a source electrode 161 and a drain electrode 162 are disposed on the interlayer dielectric layer 150. The source electrode 161 and the drain electrode 162 are spaced apart from each other and connected with the active layer 140.

Referring to FIG. 11M, before the source electrode 161 and the drain electrode 162 are formed, a contact hole can be formed in the interlayer dielectric layer 150. The source electrode 161 is connected with the first connection portion 140b through the contact hole formed in the interlayer dielectric layer 150, and the drain electrode 162 is connected with the second connection portion 140c through another contact hole formed in the interlayer dielectric layer 150.

The thin film transistors 100, 200, 300, 301, 400, 401 and 500 according to the embodiments of the present disclosure can usefully be applied to the display device. In particular, the thin film transistors 100, 200, 300, 301, 400, 401 and 500 according to the embodiments of the present disclosure can usefully be applied to an outdoor display device driven in an ON-state for a long time or a display device using a micro LED.

Figure 12:
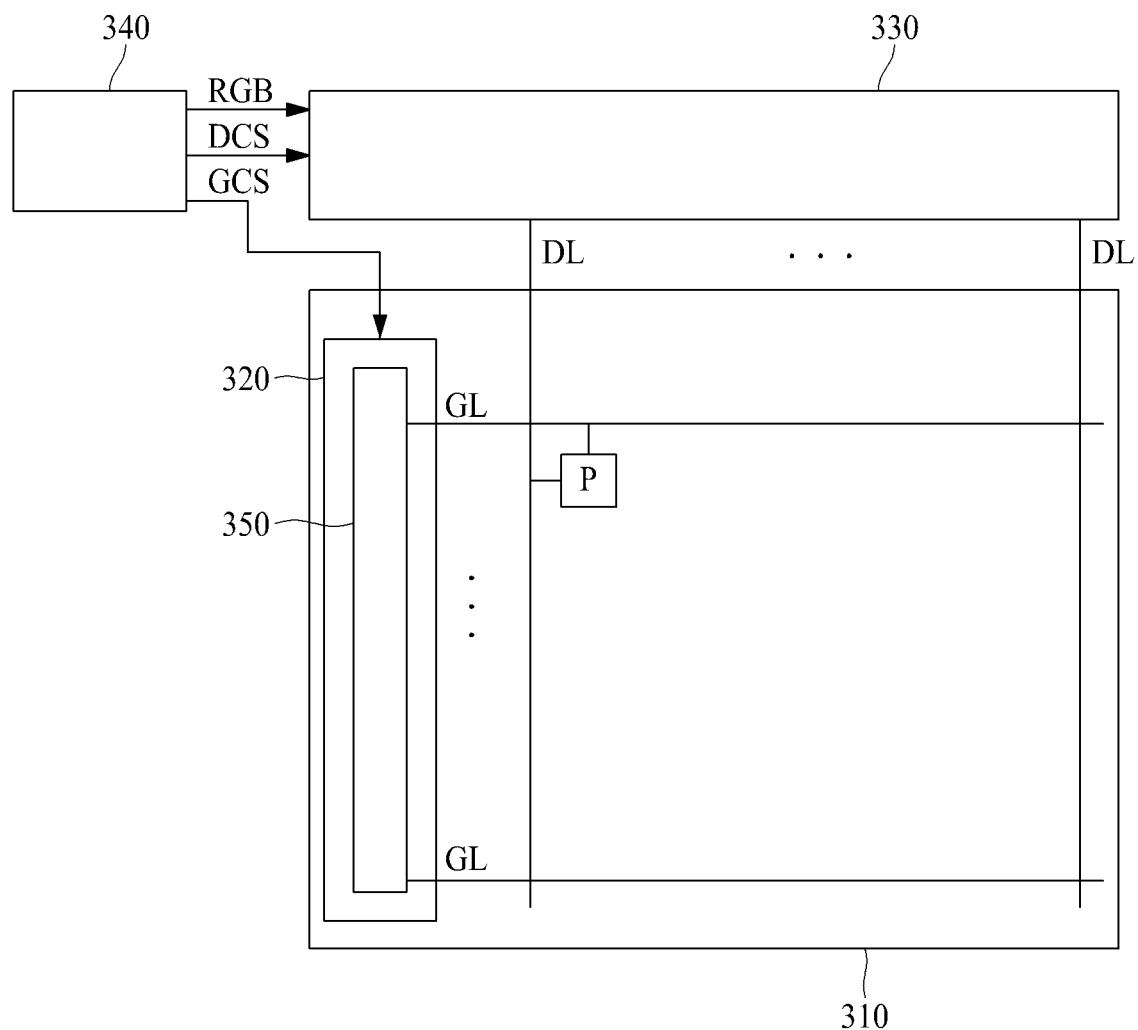
FIG. 12 is a schematic view illustrating a display device according to an embodiment of the present disclosure.

FIG. 12 is a schematic view illustrating a display device 600 according to another embodiment of the present disclosure.

Referring to FIG. 12, the display device 600 according to another embodiment of the present disclosure includes a display panel 310, a gate driver 320, a data driver 330 and a controller 340.

The display panel 310 includes gate lines GL, data lines DL, pixels P disposed in intersection areas between the gate lines GL and the data lines DL. The pixel P includes a display element 710, and a pixel driving circuit PDC for driving the display element 710. An image is displayed on the display panel 310 by driving of the pixel P.

The controller 340 controls the gate driver 320 and the data driver 330.

The controller 340 outputs a gate control signal GCS for controlling the gate driver 320 and a data control signal DCS for controlling the data driver 330 by using a synchronization signal and a clock signal, which are supplied from an external system. Also, the controller 340 samples input image data input from the external system, realigns the sampled data and supplies the realigned digital image data RGB to the data driver 330.

The gate control signal GCS includes a gate start pulse GSP, a gate shift clock GSC, a gate output enable signal GOE, a start signal Vst, and a gate clock GCLK. Also, control signals for controlling a shift register 350 can be included in the gate control signal GCS.

The data control signal DCS includes a source start pulse SSP, a source shift clock signal SSC, a source output enable signal SOE, and a polarity control signal POL.

The data driver 330 supplies a data voltage to the data lines DL of the display panel 310. In detail, the data driver 330 converts the image data RGB input from the controller 340 into an analog data voltage and supplies a data voltage of one horizontal line to the data lines DL every first horizontal period where a gate pulse is supplied to the gate line GL.

The gate driver 320 can include a shift register 350.

The shift register 350 sequentially supplies gate pulses to the gate lines GL for one frame by using the start signal and the gate clock, which are transmitted from the controller 340. In this situation, one frame means a time period when one image is output through the display panel 310. The gate pulse has a turn-on voltage that can turn on a switching element (thin film transistor) disposed in the pixel P.

Also, the shift register 350 supplies a gate-off signal capable of turning off a switching element, to the gate line GL for the other period of one frame, in which the gate pulse is not supplied. Hereinafter, the gate pulse and the gate-off signal will collectively be referred to as a scan signal SS or Scan.

According to one embodiment of the present disclosure, the gate driver 320 can be packaged on the substrate 310. In this way, a structure in which the gate driver 320 is directly packaged on the substrate 310 will be referred to as a Gate In Panel (GIP) structure. The gate driver 320 can include at least one of the thin film transistors 100, 200, 300, 301, 400, 401 or 500 shown in FIGS. 1 and 3 to 6.

Figure 13:
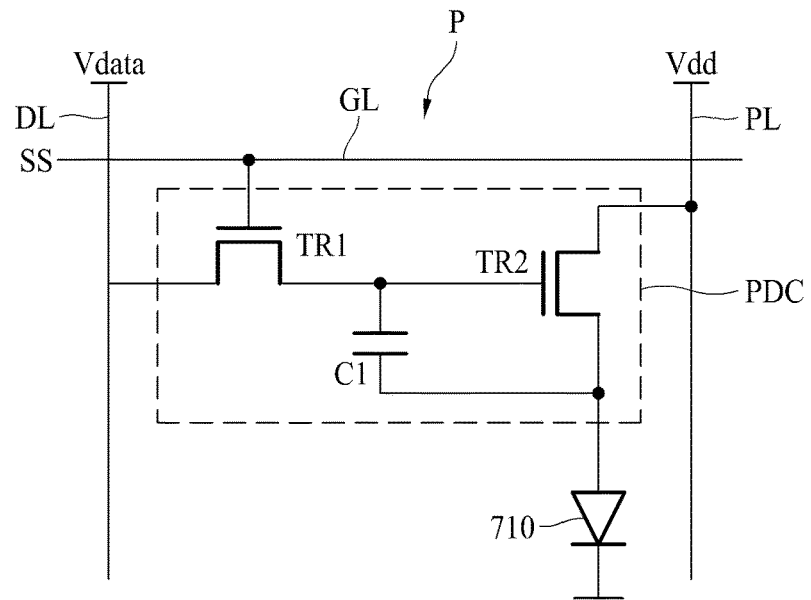
FIG. 13 is a circuit view illustrating any one pixel of FIG. 12 according to an embodiment of the present disclosure.

FIG. 13 is a circuit view illustrating any one pixel P of FIG. 12.

The circuit view of FIG. 13 is an equivalent circuit view for a pixel P of a display device 600 that includes an organic light emitting diode (OLED) as a display element 710. The pixel P includes a display element 710, and a pixel driving circuit PDC for driving the display element 710.

Referring to FIG. 13, the pixel driving circuit PDC includes a first thin film transistor TR1 that is a switching transistor, and a second thin film transistor TR2 that is a driving transistor. Each of the thin film transistors 100, 200, 300, 301, 400, 401 and 500 shown in FIGS. 1 and 3 to 6 can be used as the first thin film transistor TR1 or the second thin film transistor TR2.

The first thin film transistor TR1 is connected to the gate line GL and the data line DL, and is turned on or off by the scan signal SS supplied through the gate line GL.

The data line DL provides a data voltage Vdata to the pixel driving circuit PDC, and the first thin film transistor TR1 controls applying of the data voltage Vdata.

A driving power line PL provides a driving voltage Vdd to the display element 710, and the second thin film transistor TR2 controls the driving voltage Vdd. The driving voltage Vdd is a pixel driving voltage for driving the organic light emitting diode (OLED) that is the display element 710.

When the first thin film transistor TR1 is turned on by the scan signal SS applied from the gate driver 320 through the gate line GL, the data voltage Vdata supplied through the data line DL is supplied to a gate electrode of the second thin film transistor TR2 connected with the display element 710. The data voltage Vdata is charged in a first capacitor C1 formed between the gate electrode and a source electrode of the second thin film transistor TR2. The first capacitor C1 is a storage capacitor Cst.

The amount of a current supplied to the organic light emitting diode (OLED), which is the display element 710, through the second thin film transistor TR2 is controlled in accordance with the data voltage Vdata, whereby gray scale of light emitted from the display element 710 can be controlled.

Figure 14:
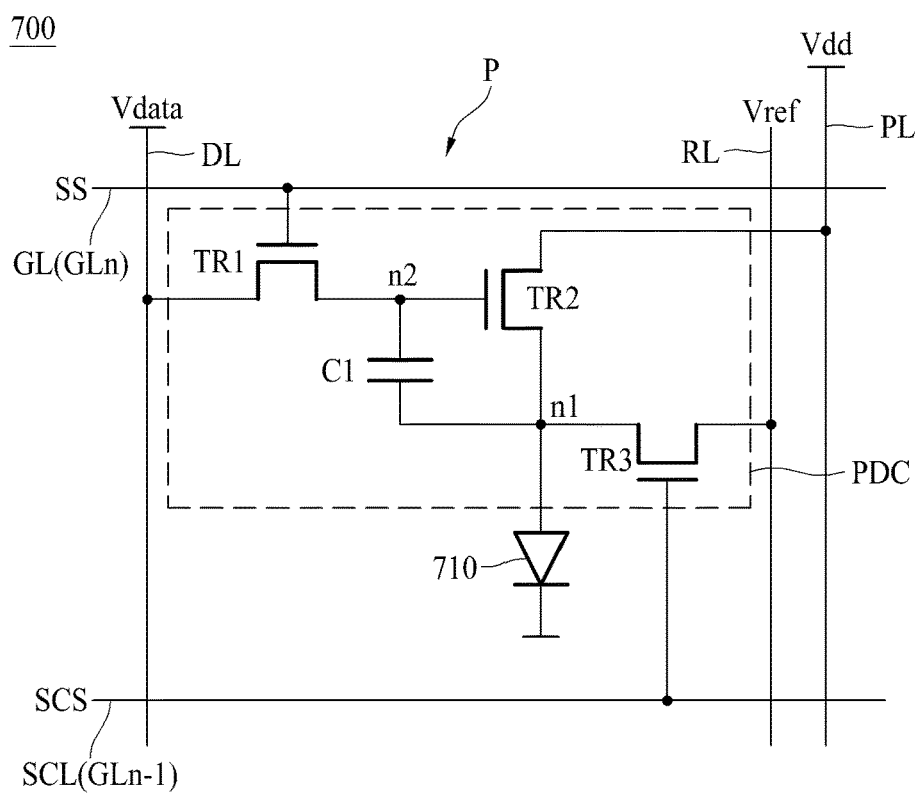
FIG. 14 is a circuit view illustrating any one pixel of a display device according to another embodiment of the present disclosure.

FIG. 14 is a circuit view illustrating a pixel P of a display device 700 according to still another embodiment of the present disclosure.

Referring to FIG. 14, the pixel P of the display device 700 includes an organic light emitting diode (OLED) that is a display element 710, and a pixel driving circuit PDC for driving the display element 710. The display element 710 is connected with the pixel driving circuit PDC.

In the pixel P, signal lines DL, GL, PL, RL and SCL for supplying a signal to the pixel driving circuit PDC are disposed.

The data voltage Vdata is supplied to the data line DL, the scan signal SS is supplied to the gate line GL, the driving voltage Vdd for driving the pixel is supplied to the driving power line PL, a reference voltage Vref is supplied to a reference line RL, and a sensing control signal SCS is supplied to a sensing control line SCL.

Referring to FIG. 14, assuming that a gate line of an nth pixel P is "$GL_n$," a gate line of a (n−1)th pixel P adjacent to the nth pixel P is "$GL_{n-1}$," and the gate line "$GL_{n-1}$" of the (n−1)th pixel P serves as a sensing control line SCL of the nth pixel P.

The pixel driving circuit PDC, for example, includes a first thin film transistor TR1 (switching transistor) connected with the gate line GL and the data line DL, a second thin film transistor TR2 (driving transistor) for controlling a magnitude of a current output to the display element 710 in accordance with the data voltage Vdata transmitted through the first thin film transistor TR1, and a third thin film transistor TR3 (reference transistor) for sensing characteristics of the second thin film transistor TR2.

A first capacitor C1 is disposed between a gate electrode of the second thin film transistor TR2 and the display element 710. The first capacitor C1 is referred to as a storage capacitor Cst.

The first thin film transistor TR1 is turned on by the scan signal SS supplied to the gate line GL to transmit the data voltage Vdata, which is supplied to the data line DL, to the gate electrode G2 of the second thin film transistor TR2.

The third thin film transistor TR3 is connected to a first node n1 between the second thin film transistor TR2 and the display element 710 and the reference line RL and thus turned on or off by the sensing control signal SCS, and senses characteristics of the second thin film transistor TR2, which is a driving transistor, for a sensing period.

A second node n2 connected with the gate electrode of the second thin film transistor TR2 is connected with the first thin film transistor TR1. The first capacitor C1 is formed between the second node n2 and the first node n1.

When the first thin film transistor TR1 is turned on, the data voltage Vdata supplied through the data line DL is supplied to the gate electrode of the second thin film transistor TR2. The data voltage Vdata is charged in the first capacitor C1 formed between the gate electrode and the source electrode of the second thin film transistor TR2.

When the second thin film transistor TR2 is turned on, the current is supplied to the display element 710 through the second thin film transistor TR2 in accordance with the driving voltage Vdd for driving the pixel, whereby light is output from the display element 710.

At least one of the first thin film transistor TR1, the second thin film transistor TR2 or the third thin film transistor TR3 of FIG. 14 can have the same structure as that of any one of the thin film transistors 100, 200, 300, 301, 400, 401 and 500 shown in FIGS. 1 and 3 to 6.

Figure 15:
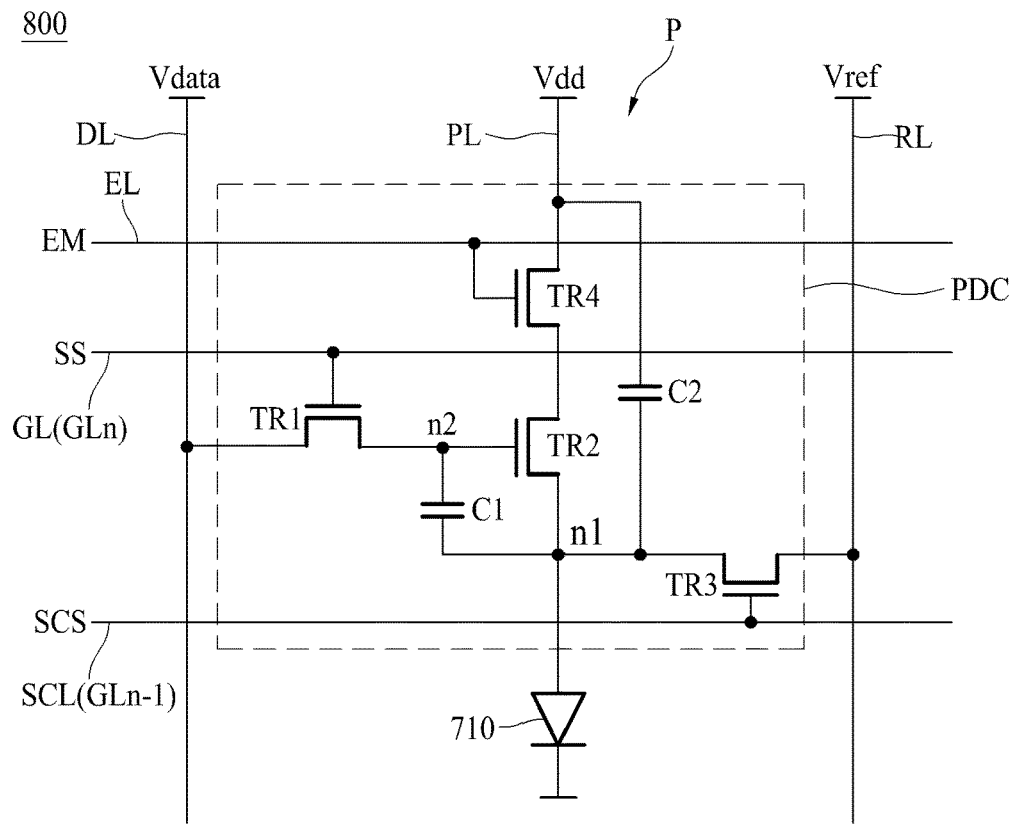
FIG. 15 is a circuit view illustrating any one pixel of a display device according to still another embodiment of the present disclosure.

FIG. 15 is a circuit view illustrating any one pixel P of a display device 800 according to further still another embodiment of the present disclosure.

Referring to FIG. 15, the pixel P of the display device 800 includes an organic light emitting diode (OLED) that is a display element 710, and a pixel driving circuit PDC for driving the display element 710. The display element 710 is connected with the pixel driving circuit PDC.

The pixel driving circuit PDC includes thin film transistors TR1, TR2, TR3 and TR4.

In the pixel P, signal lines DL, EL, GL, PL, SCL and RL for supplying a driving signal to the pixel driving circuit PDC are disposed.

In comparison with the pixel P of FIG. 14, the pixel P of FIG. 15 further includes an emission control line EL. An emission control signal EM is supplied to the emission control line EL.

Also, the pixel driving circuit PDC of FIG. 15 further includes a fourth thin film transistor TR4 that is an emission control transistor for controlling a light emission timing of the second thin film transistor TR2, in comparison with the pixel driving circuit PDC of FIG. 14.

Referring to FIG. 15, assuming that a gate line of an nth pixel P is "$GL_n$," a gate line of a (n−1)th pixel P adjacent to the nth pixel P is "$GL_{n-1}$," and the gate line "$GL_{n-1}$" of the (n−1)th pixel P serves as a sensing control line SCL of the nth pixel P.

A first capacitor C1 is positioned between the gate electrode of the second thin film transistor TR2 and the display element 710. A second capacitor C2 is positioned between one of terminals of the fourth thin film transistor TR4, to which a driving voltage Vdd is supplied, and one electrode of the display element 710.

The first thin film transistor TR1 is turned on by the scan signal SS supplied to the gate line GL to transmit the data voltage Vdata, which is supplied to the data line DL, to the gate electrode of the second thin film transistor TR2.

The third thin film transistor TR3 is connected to the reference line RL and thus turned on or off by the sensing control signal SCS, and senses characteristics of the second thin film transistor TR2, which is a driving transistor, for a sensing period.

The fourth thin film transistor TR4 transfers the driving voltage Vdd to the second thin film transistor TR2 in accordance with the emission control signal EM, or shields the driving voltage Vdd. When the fourth thin film transistor is turned on, a current is supplied to the second thin film transistor TR2, whereby light is output from the display element 710.

At least one of the first thin film transistor TR1, the second thin film transistor TR2, the third thin film transistor TR3 or the fourth thin film transistor TR4 of FIG. 15 can have the same structure as that of any one of the thin film transistors 100, 200, 300, 301, 400, 401 and 500 shown in FIGS. 1 and 3 to 6.

The pixel driving circuit PDC according to further still another embodiment of the present disclosure can be formed in various structures in addition to the above-described structure. The pixel driving circuit PDC, for example, can include five or more thin film transistors.

Figure 16:
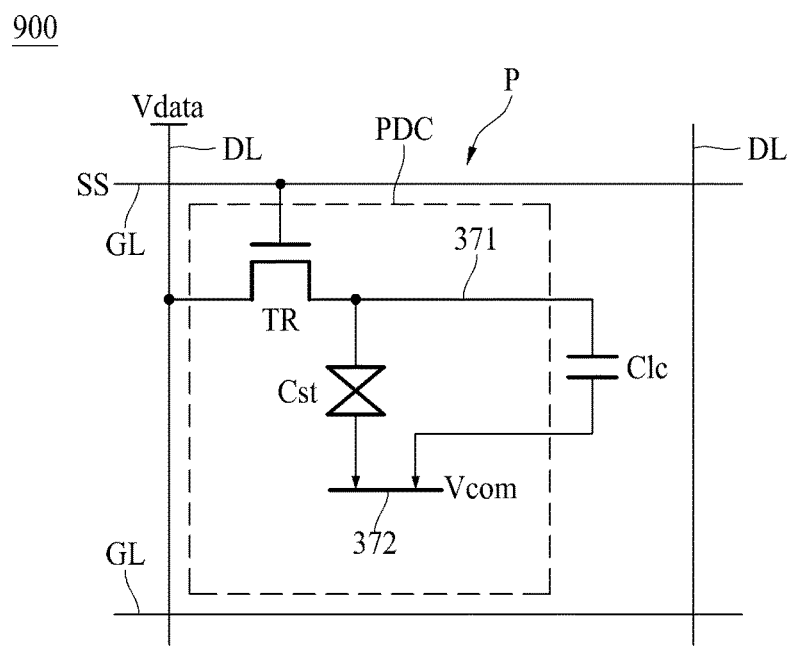
FIG. 16 is a circuit view illustrating any one pixel of a display device according to further still another embodiment of the present disclosure.

FIG. 16 is a circuit view illustrating a pixel P of a display device 900 according to further still another embodiment of the present disclosure. The display device 900 of FIG. 16 is a liquid crystal display device as an example.

Referring to FIG. 16, the pixel P of the display device 900 includes a pixel driving circuit PDC, and a liquid crystal capacitor Clc connected with the pixel driving circuit PDC. The liquid crystal capacitor Clc corresponds to a display element.

The pixel driving circuit PDC includes a thin film transistor TR connected with the gate line GL and the data line DL, and a storage capacitor Cst connected between the thin film transistor TR and a common electrode 372. The liquid crystal capacitor Clc is connected with the storage capacitor Cst in parallel between a pixel electrode 371 connected to the thin film transistor TR and the common electrode 372.

The liquid crystal capacitor Clc charges a differential voltage between a data signal supplied to a pixel electrode through the thin film transistor TR and a common voltage Vcom supplied to the common electrode 372, and controls a light-transmissive amount by driving liquid crystals in accordance with the charged voltage. The storage capacitor Cst stably maintains the voltage charged in the liquid crystal capacitor Clc.

The display device 900 according to further still another embodiment of the present disclosure can include at least one of the thin film transistors 100, 200, 300, 301, 400, 401 or 500 shown in FIGS. 1, 3, 4, 5 and 6.

According to one or more embodiments of the present disclosure, the following advantageous effects and advantages can be obtained.

Since the thin film transistor according to one embodiment of the present disclosure includes a portion affected by a top gate and a portion affected by a bottom gate in one channel portion, respectively, the change rate of the threshold voltage is very small, whereby driving stability can be obtained and secured.

The thin film transistor according to one embodiment of the present disclosure includes a channel portion that includes an excess oxygen area and an excess hydrogen area. Movement of the threshold voltage in the positive (+) direction is induced in the excess oxygen area by electron trap, and movement of the threshold voltage in the negative (−) direction is induced in the excess hydrogen area by hole trap. In the thin film transistor according to one embodiment of the present disclosure, the excess oxygen area for moving the threshold voltage in the positive (+) direction and the excess hydrogen area for moving the threshold voltage in the negative (−) direction are connected with each other in series, whereby the change rate of the threshold voltage of the thin film transistor is reduced, and driving stability is improved. In particular, the thin film transistor according to one embodiment of the present disclosure can stably operate without change of the threshold voltage even in the situation that the thin film transistor is driven in an ON-state for a long time.

The thin film transistor according to one embodiment of the present disclosure can be disposed in various electronic devices, and when the thin film transistor according to one embodiment of the present disclosure is used, driving stability of the electronic device can be improved. The thin film transistor according to one embodiment of the present disclosure can usefully be applied to the display device, and particularly, can be applied to an outdoor display device driven in an ON-state for a long time and a display device using a micro LED.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A thin film transistor comprising:
    a first gate electrode;
    an active layer spaced apart from the first gate electrode, the active layer including a channel portion; and
    a second gate electrode spaced apart from the active layer, wherein the active layer is between the first gate electrode and the second gate electrode,
    at least a portion of the first gate electrode does not overlap with the second gate electrode, and at least a portion of the second gate electrode does not overlap with the first gate electrode,
    the channel portion overlaps with at least one of the first gate electrode and the second gate electrode,
    a first portion of the channel portion overlaps with only one of the first gate electrode and the second gate electrode, and a second portion of the channel portion overlaps with only a remaining one of the first gate electrode and the second gate electrode that is not overlapped by the first portion of the channel portion,
    the active layer further includes:
        a first active layer including an oxide semiconductor material; and
        a second active layer disposed on the first active layer, the second active layer including an oxide semiconductor material, and
    the first active layer has a higher hydrogen concentration and a lower oxygen concentration than the second active layer, or the second active layer has a higher hydrogen concentration and a lower oxygen concentration than the first active layer.

2. The thin film transistor of claim 1, wherein the channel portion includes:
    a first channel area that overlaps with the first gate electrode and does not overlap with the second gate electrode; and
    a second channel area that overlaps with the second gate electrode and does not overlap with the first gate electrode.

3. The thin film transistor of claim 2, wherein the first channel area and the second channel area are positioned at opposite ends of the channel portion.

4. The thin film transistor of claim 2, wherein the active layer includes a first connection portion and a second connection portion, the first and second connection portions being separated from each other and respectively connected to the channel portion.

5. The thin film transistor of claim 4, wherein the first connection portion is in contact with the first channel area, and the second connection portion is in contact with the second channel area.

6. The thin film transistor of claim 5, wherein the first connection portion does not overlap with the second gate electrode, and the second connection portion does not overlap with the first gate electrode.

7. The thin film transistor of claim 5, wherein at least a portion of the first connection portion overlaps with the first gate electrode.

8. The thin film transistor of claim 1, wherein a portion of the first gate electrode overlaps with a portion of the second gate electrode.

9. The thin film transistor of claim 1, wherein a portion of the channel portion overlaps both of at least a portion of the first gate electrode and at least a portion of the second gate electrode.

10. The thin film transistor of claim 1, further comprising a hydrogen supply layer disposed between the first gate electrode and the active layer, or on the active layer.

11. The thin film transistor of claim 1, further comprising an oxygen supply layer disposed between the active layer and the second gate electrode.

12. The thin film transistor of claim 1, wherein the first active layer and the second active layer have a same metal composition.

13. The thin film transistor of claim 1, wherein the first active layer has a higher hydrogen concentration than the second active layer, and the second active layer has an oxygen concentration higher than the first active layer, or wherein the first active layer has a higher oxygen concentration than the second active layer, and the second active layer has a higher hydrogen concentration than the first active layer.

14. The thin film transistor of claim 1, wherein the first active layer has a first area overlapped with the first gate electrode, and the first area has a hydrogen concentration higher than a second area of the first active layer that does not overlap with the first gate electrode.

15. The thin film transistor of claim 1, wherein the second active layer has a second area overlapped with the second gate electrode, and the second area has an oxygen concentration higher than a first area of the second active layer that does not overlap with the second gate electrode.

16. A display device comprising:
a display panel configured to display an image; and
the thin film transistor of claim 1.

* * * * *